(12) United States Patent
Kishi et al.

(10) Patent No.: US 10,822,716 B2
(45) Date of Patent: Nov. 3, 2020

(54) QUARTZ GLASS CRUCIBLE AND MANUFACTURING METHOD THEREOF

(71) Applicant: SUMCO CORPORATION, Tokyo (JP)

(72) Inventors: Hiroshi Kishi, Akita (JP); Masanori Fukui, Akita (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/308,789

(22) PCT Filed: Aug. 17, 2017

(86) PCT No.: PCT/JP2017/029543
§ 371 (c)(1),
(2) Date: Dec. 10, 2018

(87) PCT Pub. No.: WO2018/051714
PCT Pub. Date: Mar. 22, 2018

(65) Prior Publication Data
US 2019/0316271 A1    Oct. 17, 2019

(30) Foreign Application Priority Data
Sep. 13, 2016 (JP) ................................. 2016-178309

(51) Int. Cl.
*C30B 15/10* (2006.01)
*C03B 19/09* (2006.01)
(Continued)

(52) U.S. Cl.
CPC ............ *C30B 15/10* (2013.01); *C03B 19/095* (2013.01); *C03B 20/00* (2013.01); *C30B 29/06* (2013.01)

(58) Field of Classification Search
CPC ......... C30B 15/00; C30B 29/18; C30B 15/10; C30B 35/002
See application file for complete search history.

(56) References Cited

U.S. PATENT DOCUMENTS

2003/0024467 A1* 2/2003 Phillips ................... C30B 15/10
                                                                117/20
2006/0144327 A1   7/2006 Ohama et al.
(Continued)

FOREIGN PATENT DOCUMENTS

CN    102312286 A    1/2012
CN    102534756 A    7/2012
(Continued)

OTHER PUBLICATIONS

International Search Report (ISR) dated Nov. 21, 2017, issued for International application No. PCT/JP2017/029543.
(Continued)

*Primary Examiner* — Robert M Kunemund
(74) *Attorney, Agent, or Firm* — Law Office of Katsuhiro Arai

(57) ABSTRACT

In an exemplary embodiment, a quartz glass crucible 1 includes: a high-aluminum-content layer 14B which is made of quartz glass having a relatively high average aluminum concentration and is provided to form an outer surface 10b of the quartz glass crucible 1; and a low-aluminum-content layer 14A which is made of quartz glass having a lower average aluminum concentration than that of the high-aluminum-content layer 14B and is provided on an inner side of the high-aluminum-content layer 14B, wherein the low-aluminum-content layer 14A includes an opaque layer 11 made of quartz glass containing a large number of minute bubbles, and the high-aluminum-content layer 14B is made of transparent or translucent quartz glass having a lower bubble content than that of the opaque layer 11. The quartz glass crucible is capable of withstanding a single crystal pull-up step undertaken for a very long period of time.

27 Claims, 9 Drawing Sheets

(51) Int. Cl.
  *C03B 20/00* (2006.01)
  *C30B 29/06* (2006.01)

(56) References Cited

U.S. PATENT DOCUMENTS

| | | |
|---|---|---|
| 2011/0315072 A1 | 12/2011 | Sudo et al. |
| 2012/0160158 A1 | 6/2012 | Sudo et al. |
| 2016/0115625 A1 | 4/2016 | Sudo et al. |

FOREIGN PATENT DOCUMENTS

| | | | |
|---|---|---|---|
| JP | H11236234 A | | 8/1999 |
| JP | 2000247778 A | | 9/2000 |
| JP | 20002477778 | * | 9/2000 |
| JP | 2001348294 A | | 12/2001 |
| JP | 2006124235 A | | 5/2006 |
| JP | 2009084085 A | | 4/2009 |
| JP | 2011032147 A | | 2/2011 |
| JP | 2011073925 A | | 4/2011 |
| JP | 2012006805 A | | 1/2012 |
| JP | 2012072038 A | | 4/2012 |
| WO | 2004106247 A1 | | 12/2004 |
| WO | WO 2004106247 | * | 12/2004 |

OTHER PUBLICATIONS

A First Office Action issued by the State Intellectual Property Office of China dated Jun. 30, 2020 for Chinese counterpart application No. 201780030570.7 (8 pages).

* cited by examiner

| SAMPLE NAME | Al CONCENTRATION (ppm) |
|---|---|
| (1) (SURFACE TO 30 μm) | 378 |
| (2) (40 TO 70 μm) | 14 |
| (3) (80 TO 110 μm) | 15 |
| (4) (120 TO 150 μm) | 16 |
| (5) (160 TO 190 μm) | 13 |
| (6) (200 TO 230 μm) | 15 |
| (7) (240 TO 270 μm) | 14 |

FIG. 8

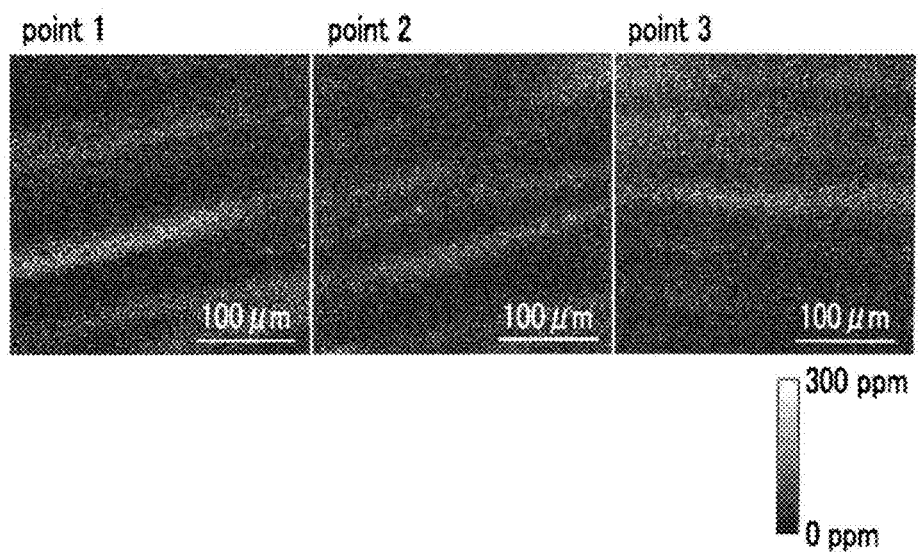

FIG. 9

| | | TYPICAL CRUCIBLE | CRUCIBLE WITH OUTER SURFACE CRYSTALLIZED (TYPICAL HIGH ALUMINUM CONTAINING LAYER) | CRUCIBLE WITH OUTER SURFACE CRYSTALLIZED (HIGH ALUMINUM CONTAINING LAYER SUBJECTED TO DEGASSING TREATMENT) |
|---|---|---|---|---|
| CROSS-SECTIONAL VIEW (OUTER SURFACE SIDE) | | NATURAL LAYER / OUTER SURFACE | NATURAL LAYER / HIGH ALUMINUM CONTAINING LAYER / OUTER SURFACE | NATURAL LAYER / HIGH ALUMINUM CONTAINING LAYER / OUTER SURFACE |
| CARBON CONCENTRATION (ppm) | NATURAL LAYER | 4.2 | 4.2 | 4.2 |
| | HIGH ALUMINUM CONTAINING LAYER | - | 6.8 | 4.9 |
| SULFUR CONCENTRATION (ppm) | NATURAL LAYER | 4.7 | 4.7 | 4.7 |
| | HIGH ALUMINUM CONTAINING LAYER | - | 8.2 | 3.2 |
| BUBBLE CONTENT (%) | NATURAL LAYER | 2.5 | 2.5 | 2.5 |
| | HIGH ALUMINUM CONTAINING LAYER | - | 2.7 | 2.1 |

FIG. 10

| | AVERAGE ALUMINUM CONCENTRATION IN HIGH ALUMINUM CONTAINING LAYER (ppm) | CRYSTALLIZATION RATE (μm/h) | PRETREATMENT OF ALUMINUM-ADDED QUARTZ POWDER | DECOMPRESSION MELTING OF HIGH ALUMINUM CONTAINING LAYER | BUBBLE CONTENT IN HIGH ALUMINUM CONTAINING LAYER (%) | FOAMING AND DELAMINATION OF CRYSTALLIZED LAYER |
|---|---|---|---|---|---|---|
| COMPARATIVE EXAMPLE 1 | 100 | 48 | ABSENT | ABSENT | 2.7 | PRESENT |
| COMPARATIVE EXAMPLE 2 | 100 | 48 | PRESENT | ABSENT | 2.2 | PRESENT |
| EXAMPLE 1 | 100 | 48 | ABSENT | PRESENT | 1.0 | ABSENT |
| COMPARATIVE EXAMPLE 3 | 30 | 20 | ABSENT | ABSENT | 2.5 | PRESENT |
| COMPARATIVE EXAMPLE 4 | 30 | 20 | PRESENT | ABSENT | 2.0 | PRESENT |
| EXAMPLE 2 | 30 | 20 | ABSENT | PRESENT | 0.6 | ABSENT |
| EXAMPLE 3 | 30 | 20 | PRESENT | PRESENT | 0.4 | ABSENT |
| COMPARATIVE EXAMPLE 5 | 20 | 12 | ABSENT | ABSENT | 2.4 | PRESENT |
| EXAMPLE 4 | 20 | 12 | PRESENT | ABSENT | 2.0 | ABSENT |
| EXAMPLE 5 | 20 | 12 | ABSENT | PRESENT | 0.5 | ABSENT |

QUARTZ GLASS CRUCIBLE AND MANUFACTURING METHOD THEREOF

CROSS-REFERENCE TO RELATED APPLICATIONS

This application is the U.S. National Phase under 35 U.S.C. § 371 of International Application PCT/JP2017/029543, filed Aug. 17, 2017, which claims priority to Japanese Patent Application No. 2016-178309, filed Sep. 13, 2016. The International Application was published under PCT Article 21(2) in a language other than English.

TECHNICAL FIELD

The present invention relates to a quartz glass crucible used for manufacturing a silicon single crystal by the Czochralski method (hereinafter, referred to as the "CZ method") and a manufacturing method thereof and, particularly to a structure for increasing the strength of a quartz glass crucible and a manufacturing method thereof.

BACKGROUND ART

A quartz glass crucible is used for manufacturing a silicon single crystal by the CZ method. In the CZ method, a polycrystalline silicon raw material is heated in the quartz glass crucible for melting, a seed crystal is dipped into the silicon melt in the rotating crucible, and then the seed crystal is gradually pulled up to grow a single crystal. In order to manufacture a high quality silicon single crystal for a semiconductor device at low costs, it is desirable to perform so-called multi-pulling in which not only can the yield of single crystals be increased by a single pull-up step, a plurality of silicon single crystal ingots can be pulled up from a single crucible by adding a silicon raw material to the crucible. For this, a crucible having a stable shape capable of withstanding long-term use is necessary.

In a quartz glass crucible of the related art, the viscosity is reduced at a high temperature of 1400° C. or higher during pulling up a silicon single crystal, so that the shape thereof cannot be maintained and deformation of the crucible such as buckling or collapse to the inside occurs. Accordingly, variations in the liquid surface level of a silicon melt, breakage of the crucible, contact with components in a furnace, and the like become problems.

In order to solve such problems, for example, Patent Document 1 describes a quartz glass crucible having a three-layer structure consisting of a high-concentration aluminum-added quartz layer as an outer layer of the crucible, a natural quartz layer or high-purity synthetic quartz layer as an intermediate layer, and a transparent high-purity synthetic quartz layer as an inner layer. In a step of pulling up a silicon single crystal using the quartz glass crucible, crystallization (nucleation) of the outer layer of the crucible is caused by being held at 1200° C. or higher for a predetermined time before increasing the temperature up to 1430° C., which is the melting point of silicon. Thus, it is possible to obtain an effect of significantly improving the viscosity by the growth of cristobalite.

In Patent Document 2, a first outer layer containing aluminum at a low concentration, a second outer layer containing aluminum at a high concentration, an opaque intermediate layer made of natural raw material silica glass, and a transparent inner layer made of natural raw material silica glass or synthetic raw material silica glass are provided in this order from the outer side toward the inner side of a crucible, and the crystallization rate of the first outer layer and the second outer layer are maintained constant to improve durability. In addition, since an aluminum-containing layer is not provided at the bottom portion of the crucible, adhesion to a carbon susceptor can be improved.

Patent Document 3 describes that the bottom portion of a crucible has a three-layer structure of a transparent layer, an opaque layer, and a transparent layer provided from the outer side toward the inner side, with the result that the heat transfer and heat dissipation properties are improved by providing the transparent or translucent layers at the bottom portion, which in turn the crucible cooling time is shortened. In addition, an outer wall portion is formed into a bubble layer for shape stability property.

Patent Document 4 describes that a transparent silica glass layer, an aluminum-containing bubble-containing silica glass layer, and a translucent silica glass layer are provided in this order from the inner surface to the outer surface of a crucible, and the translucent silica glass layer has a bubble content of 0.5% or more and less than 1% and an OH group concentration of 35 ppm or more and less than 300 ppm. According to the silica glass crucible, OH groups inside the translucent silica glass layer are trapped by bubbles and expanded to lower the density, thereby preventing collapse to the inside and the like.

Patent Document 5 describes a method in which an opaque high-concentration aluminum layer, an opaque medium-concentration aluminum layer, and a transparent low-concentration aluminum layer are formed in this order from the outer side toward the inner side of a crucible, so that deformation (corrugation) of the crucible is prevented by gradually increasing the aluminum concentration toward the outer side of the crucible.

Patent Document 6 describes a method of manufacturing an opaque quartz glass ring by filling a ring-shaped mold having heat resistance property with a mixed powder of a crystalline silica powder and a silicon nitride powder, and then setting and heating the mixed powder in an electric furnace at a melting temperature or higher for vitrification, in which the mixed powder is held at a temperature of 1400° C. or higher and 1650° C. or lower for one or more hours in a temperature raising course of heating the mixed powder from room temperature in a vacuum atmosphere. By holding the mixed powder at a temperature of 1400° C. or higher and 1650° C. or lower for one or more hours, sublimation gas derived from the crystalline silica powder is discharged to the outside of the mold, so that it is possible to obtain an opaque quartz glass with no cavities or a collection of air bubbles in the glass center portion.

BACKGROUND ART LITERATURE

Patent Document

Patent Document 1 Japanese Patent Application Laid-Open No. 2000-247778
Patent Document 2 Japanese Patent Application Laid-Open No. 2009-084085
Patent Document 3 Japanese Patent Application Laid-Open No. 2011-073925
Patent Document 4 Japanese Patent Application Laid-Open No. 2012-006805
Patent Document 5 WO2004/106247
Patent Document 6 Japanese Patent Application Laid-Open No. H11-236234

SUMMARY OF THE INVENTION

Problems to be Solved by the Invention

In a quartz glass crucible for pulling up a silicon single crystal, the inner surface of the crucible wall which is in contact with a silicon melt is required to have a high purity in order to prevent contamination of the silicon melt and is also required to have a bubble-free layer (transparent layer) in order to prevent single crystallization of silicon from being impeded by crucible fragments and the like when bubbles are broken if the bubbles are contained therein. In addition, the crucible wall other than the inner surface is required to be a bubble layer so as to cause the silicon melt in the crucible to be uniformly heated without radiant heat from a heater being transmitted therethrough. Any of the quartz glass crucibles of the related art described above has a two-layer structure including a bubble layer on the outer side of the crucible and a transparent layer on the inner side, in which an aluminum (Al)-containing layer is provided in the bubble layer and is made of an opaque glass containing a large number of bubbles.

However, if bubbles are present in the aluminum-containing layer or its vicinity, when the aluminum-containing layer is crystallized due to a high temperature during pulling up a silicon single crystal, gas released from the inside of the glass structure ($CO_2$, $N_2$, $O_2$, or OH groups) diffuses and expands to the surrounding air bubbles, so that foaming and delamination occurs in the vicinity of the interface between the crystallized layer and the glass layer, thereby causing a problem of the deformation of the crucible. Even in a case where the released gas does not diffuse into the bubbles, when the aluminum-containing layer is crystallized while containing bubbles therein, cracks easily occur in the crystallized layer, and the crucible wall is easily broken.

Accordingly, an object of the present invention is to provide a quartz glass crucible capable of withstanding a single crystal pull-up step taken for a very long period of time, such as multi-pulling, and a manufacturing method thereof.

Means for Solving the Problems

To solve the above problems, a quartz glass crucible for pulling up a silicon single crystal according to the present invention includes: a high-aluminum-content layer which is made of quartz glass having a relatively high average aluminum concentration and is provided to form an outer surface of the quartz glass crucible; and a low-aluminum-content layer which is made of quartz glass having a lower average aluminum concentration than that in the high-aluminum-content layer and is provided on an inner side of the high-aluminum-content layer. The low-aluminum-content layer includes an opaque layer made of quartz glass containing a large number of minute bubbles, and the high-aluminum-content layer is made of transparent or translucent quartz glass having a lower bubble content than the opaque layer.

With the quartz glass crucible according to the present invention, since the high-aluminum-content layer is provided on the outer surface side of the crucible and no bubbles are present in the high-aluminum-content layer, even when the high-aluminum-content layer is crystallized and the crystallization proceeds toward the inside of the crucible, cohesion and expansion of the bubbles does not occur, with the result that deformation of the crucible can be prevented. In addition, since the crystallized layer with no bubbles contained therein is formed, the crystallized layer in which cracks are less likely to occur can be realized. Therefore, it is possible to withstand a single crystal pull-up step taken for a very long period of time, such as multi-pulling.

It is preferable that the quartz glass crucible according to the present invention further includes: an inner transparent layer which is provided on an inner side of the opaque layer to form an inner surface of the quartz glass crucible and contains substantially no bubbles; and an outer transparent layer which is provided outside the opaque layer to form an outer surface of the quartz glass crucible and contains substantially no bubbles, in which a thickness of the high-aluminum-content layer is thinner than the outer transparent layer. With this configuration, the high-aluminum-content layer can be included in the outer transparent layer, so that the high-aluminum-content layer having no bubbles contained therein can be realized. In addition, even when the high-aluminum-content layer is crystallized by heating during pull-up and the crystallized layer is thickened, the high-aluminum-content layer does not reach the opaque layer containing bubbles, so that the occurrence of cohesion and expansion of bubbles can be prevented, thereby preventing deformation of the crucible.

It is preferable that the quartz glass crucible according to the present invention further includes: a cylindrical straight body portion; a curved bottom portion; and a corner portion which connects the straight body portion to the bottom portion, in which the high-aluminum-content layer is provided in at least the straight body portion. As long as the high-aluminum-content layer is provided in at least the straight body portion of the crucible, it is possible to realize a quartz glass crucible in which collapse to the inside is less likely to occur during a crystal pull-up step taken for a long period of time.

In the present invention, it is preferable that the average aluminum concentration in the high-aluminum-content layer is 20 ppm or more, and an average aluminum concentration in the low-aluminum-content layer is less than 20 ppm. As described above, when the aluminum concentration in the high-aluminum-content layer is 20 ppm or more, a crystallization acceleration action by aluminum can be obtained.

In the present invention, a bubble content in the outer transparent layer is 2.1% or less. When the bubble content in the outer transparent layer is 2.1% or less, substantially no bubbles are present in the high-aluminum-content layer. Therefore, even when the high-aluminum-content layer is crystallized and the crystallization proceeds toward the inside of the crucible, cohesion or expansion of bubbles does not occur, with the result that deformation of the crucible can be prevented.

In the present invention, it is preferable that an aluminum concentration distribution in the high-aluminum-content layer is microscopically unevenly distributed. In this case, it is preferable that a part with a high aluminum concentration is present in a mesh form within a region of 1 $mm^3$ in the high-aluminum-content layer, and it is particularly preferable that a high concentration region having an aluminum concentration of 60 ppm or more and a low concentration region having an aluminum concentration of less than 25 ppm coexist within a region of 1 $mm^2$. Furthermore, an aluminum concentration gradient in the vicinity of a boundary between the high concentration region and the low concentration region is preferably 1 ppm/μm or more and 100 ppm/μm or less, and more preferably 1 ppm/μm or more and 10 ppm/μm or less.

According to the present invention, crystallization of quartz glass can be accelerated in the region having a high aluminum concentration, while in the region having a low aluminum concentration, a reduction in the viscosity of the quartz glass can be suppressed, with the result that deformation of the crucible can be prevented until the entire high-aluminum-content layer is crystallized. In addition, even when the temperature is not held for a predetermined time at a temperature for the formation of crystal nuclei during pulling up a single crystal due to the rapid proceeding of the crystallization, the strength of the crucible can be secured from the initial state of the pull-up, so that the strength of the crucible can be further increased as the crystallization further proceeds.

In the present invention, it is preferable that an average concentration of each of carbon and sulfur in the high-aluminum-content layer is 5 ppm or less. In addition, it is preferable that the bubble content in the high-aluminum-content layer is less than 0.5%.

According to the present invention, the probability of the generation of bubbles when the high-aluminum-content layer is crystallized during pulling up a silicon single crystal can be further reduced. Therefore, the probability of deformation of the crucible caused by foaming and delamination in the vicinity of the interface between the crystallized layer and the glass layer due to cohesion and expansion of the bubbles can be further reduced.

In addition, a manufacturing method of a quartz glass crucible according to the present invention includes: a step of forming a deposition layer of raw material quartz powder by depositing aluminum-added quartz powder and natural quartz powder in this order on an inner surface of a rotating mold; and a step of subjecting the deposition layer of the raw material quartz powder to arc melting from an inner side of the mold. The step of subjecting the deposition layer of the raw material quartz powder to the arc melting includes a step of forming an inner transparent layer made of quartz glass with substantially no bubbles contained by strengthening a degree of decompression through a large number of vent holes provided in the inner surface of the mold at the time of start of the arc melting, a step of forming an opaque layer made of quartz glass containing a large number of minute bubbles by weakening the degree of decompression after forming the inner transparent layer, and a step of forming an outer transparent layer made of quartz glass with substantially no bubbles contained by strengthening the degree of decompression again after forming the opaque layer. In the step of forming the outer transparent layer, the high-aluminum-content layer is formed by melting the aluminum-added quartz powder, and a timing at which the degree of decompression is strengthened again is controlled to form the outer transparent layer so as to cause a thickness of the outer transparent layer to be thicker than the high-aluminum-content layer.

In the present invention, the "aluminum-added quartz powder" refers to one in which aluminum is intentionally added to quartz powder having a low aluminum concentration, and the "natural quartz powder" refers to natural quartz powder to which aluminum is intentionally not added. In general, natural quartz powder contains a trace amount of various metal impurities such as aluminum and alkali metals. However, such natural quartz powder is not the aluminum-added quartz powder in the present invention. In order to define aluminum-added quartz powder, it is necessary that aluminum is contained therein at a high concentration at which aluminum is not present in quartz powder in the natural world, and it is necessary that the average aluminum concentration is 20 ppm or more.

According to the present invention, since the degree of decompression is strengthened when the aluminum-added quartz powder deposited on the inner surface of the mold is melted, the outer transparent layer including the high-aluminum-content layer containing substantially no bubbles can be reliably and easily formed. Therefore, the quartz glass crucible in which deformation due to foaming and delamination in the vicinity of the interface between the crystallized layer and the glass layer is less likely to occur can be manufactured.

In the present invention, it is preferable that a thickness of the high-aluminum-content layer is 200 μm or more. When the thickness of the high-aluminum-content layer is 200 μm or more, the thickness of the crystallized layer can be 200 μm or more, so that the effect of forming the crystallized layer can be obtained.

In the present invention, an average particle size of the aluminum-added quartz powder is preferably 100 to 400 μm, more preferably 200 to 400 μm, and even more preferably 300 to 400 μm. In addition, it is preferable that an aluminum concentration of a top surface of the aluminum-added quartz powder is 60 ppm or more, and an aluminum concentration of a center portion of the aluminum-added quartz powder is less than 25 ppm. It should be noted that the top surface of the aluminum-added quartz powder refers to a range from the outermost surface to a depth of 30 μm.

According to the present invention, the region with a high aluminum concentration and the region with a low aluminum concentration can be distributed unevenly in the high-aluminum-content layer. Accordingly, the effect of accelerating crystallization of the high-aluminum-content layer and the effect of suppressing deformation of the crucible by improving the viscosity of the quartz glass can be improved.

It is preferable that the manufacturing method of a quartz glass crucible according to the present invention, further includes a step of preparing the aluminum-added quartz powder before filling the mold with the aluminum-added quartz powder, in which the step of preparing the aluminum-added quartz powder includes a fixing step of fixing aluminum to the natural quartz powder by mixing a solution containing an aluminum compound in the natural quartz powder and thereafter dehydrating and drying the mixture, and a first heat treatment step of allowing the aluminum to penetrate into a surface layer portion of the natural quartz powder by heating the natural quartz powder to which the aluminum is fixed at a temperature of 1000° C. or higher and 1200° C. or lower, at which the natural quartz powder is not sintered. In this case, a heating time in the first heat treatment step is two hours or longer and hours or shorter, and more preferably five hours or longer and 10 hours or shorter. Accordingly, the aluminum-added quartz powder in which aluminum is concentrated on the surface of quartz particles can be easily and reliably manufactured. In addition, it is possible to prevent bubbles from being included in the quartz powder due to the sintering of the quartz powder.

In the present invention, it is preferable that an aluminum concentration distribution in the high-aluminum-content layer of the quartz glass crucible is measured by secondary ion mass spectrometry, and on the basis of measurement results of the aluminum concentration distribution, a concentration of the solution containing the aluminum compound used for manufacturing a subsequent quartz glass crucible, or a heat treatment time or a heat treatment temperature for the aluminum-added quartz powder is adjusted.

It is preferable that the manufacturing method of a quartz glass crucible according to the present invention further includes: a step of removing impurity components derived from carbon and sulfur adhered to the aluminum-added quartz powder and other manufacturing processes before filling the mold with the aluminum-added quartz powder.

According to the present invention, it is possible to remove in advance components that are the cause of the generation of bubbles, such as carbon, sulfur, nitrogen, and moisture adhered to the aluminum-added quartz powder. Therefore, the probability of the generation of bubbles when the high-aluminum-content layer is crystallized during pulling up a silicon single crystal can be further reduced, so that the probability of deformation of the crucible caused by foaming and delamination in the vicinity of the interface between the crystallized layer and the glass layer due to cohesion and expansion of the bubbles can be further reduced.

In the present invention, it is preferable that the step of removing the impurity components includes a second heat treatment step of heating the aluminum-added quartz powder in a chamber in an air atmosphere at normal pressure at 1000° C. or higher and 1200° C. or lower, a first holding step of evacuating an inside of the chamber and holding the aluminum-added quartz powder in a vacuum for a predetermined time, and a second holding step of changing the inside of the chamber to a helium atmosphere at normal pressure and holding the aluminum-added quartz powder in the helium atmosphere at normal pressure for a predetermined time. In this case, it is preferable that a heating time in the second heat treatment step is two hours or longer and 20 hours or shorter. Accordingly, it is possible to remove in advance components that are the cause of the generation of bubbles, such as carbon adhered to the aluminum-added quartz powder in a state in which aluminum is fixed to the surface of the quartz particles at a high concentration.

Effects of the Invention

According to the present invention, it is possible to provide the quartz glass crucible capable of withstanding a single crystal pull-up step taken for a very long period of time, such as multi-pulling, and the manufacturing method thereof.

BRIEF DESCRIPTION OF DRAWINGS

FIG. 8 is a TOF-SIMS ion image map showing the aluminum ion concentration distribution in a high-aluminum-content layer 14B.

FIG. 9 is a table showing measurement results of the carbon concentration, the sulfur concentration, and the bubble content of samples #1 to #3 of quartz glass crucibles.

FIG. 10 is a table showing the results of a heating test of the quartz glass crucibles.

MODE FOR CARRYING OUT THE INVENTION

Preferred embodiments of the present invention will be described in detail below with reference to the accompanying drawings.

Figure 1:
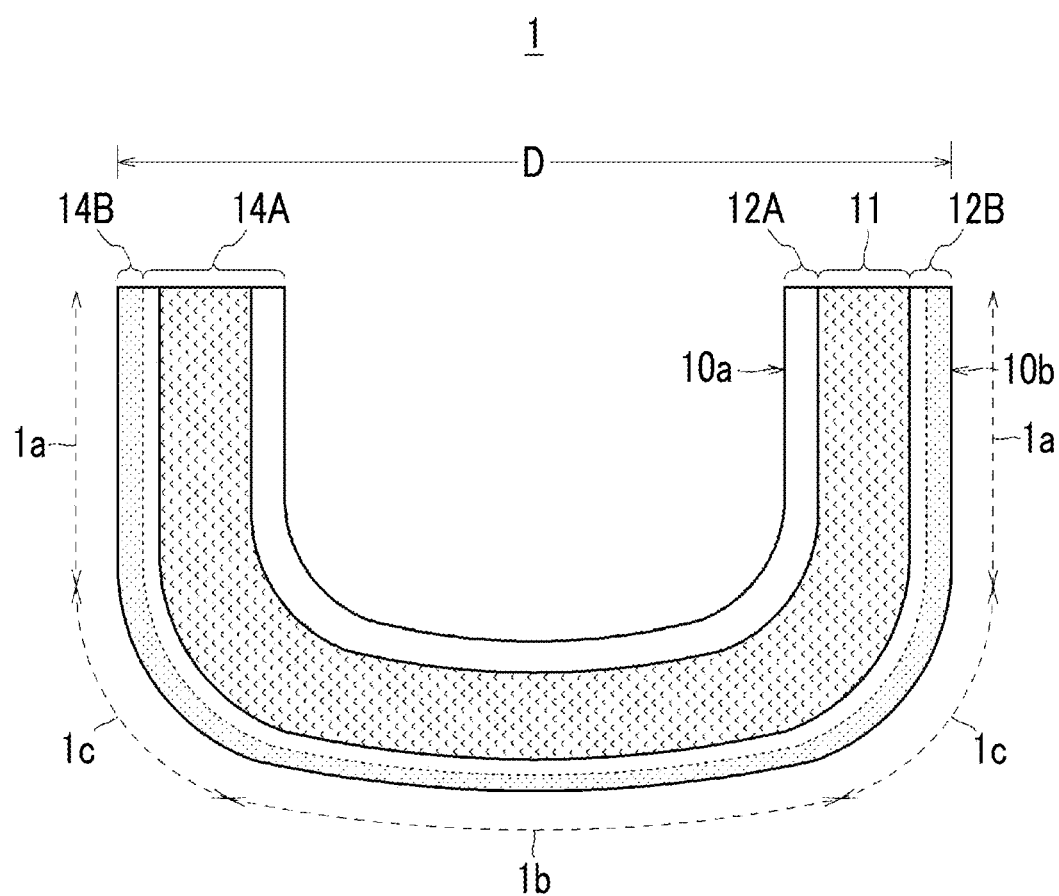
FIG. 1 is a schematic cross-sectional view illustrating the structure of a quartz glass crucible according to an embodiment of the present invention.

FIG. 1 is a schematic cross-sectional view illustrating the structure of a quartz glass crucible 1 according to an embodiment of the present invention.

As illustrated in FIG. 1, a quartz glass crucible 1 is a cylindrical container having a bottom for supporting a silicon melt, and includes a straight body portion 1a having a cylindrical shape, a bottom portion 1b which is gently curved, and a corner portion 1c which has a larger curvature than the bottom portion 1b and connects the straight body portion 1a to the bottom portion 1b.

The diameter D (aperture) of the quartz glass crucible 1 is 24 inches (about 600 mm) or more and is preferably 32 inches (about 800 mm) or more. This is because such a crucible having a large aperture is used for pulling up a large-size silicon single crystal ingot having a diameter of 300 mm or more and is required to be less likely to be deformed even when used for a long period of time. In recent years, with an increase in the size of a crucible due to an increase in the size of a silicon single crystal and an increase in the time for a pull-up step, the thermal environment of the crucible becomes more severe, and the improvement in the durability of a large crucible is an extremely important issue. Although the thickness of the crucible slightly varies depending on its part, the thickness of the straight body portion 1a of a crucible of 24 inches or more is preferably 8 mm or more, the thickness of the straight body portion 1a of a large crucible of 32 inches or more is preferably 10 mm or more, and the thickness of the straight body portion 1a of a large crucible of 40 inches (about 1000 mm) or more is more preferably 13 mm or more.

The quartz glass crucible 1 according to the embodiment has a three-layer structure, and includes an opaque layer 11 (bubble layer) made of quartz glass containing a large number of minute bubbles, an inner transparent layer 12A which is provided on an inner side of the opaque layer 11 and is made of quartz glass with substantially no bubbles contained therein, and an outer transparent layer 12B which is provided outside the opaque layer 11 and is made of quartz glass with substantially no bubbles contained therein.

The opaque layer 11 is provided in order to heat the silicon melt in the crucible as uniformly as possible without radiant heat from a heater of a single crystal pull-up apparatus being transmitted through the crucible wall. Therefore, the opaque layer 11 is provided in the entire crucible ranging from the straight body portion 1a to the bottom portion 1b of the crucible. The thickness of the opaque layer 11 is a value obtained by subtracting the thicknesses of the inner transparent layer 12A and the outer transparent layer 12B from the thickness of the crucible wall, and varies depending on the part of the crucible.

The bubble content in the quartz glass forming the opaque layer 11 is preferably 2.5% or more. The bubble content of the opaque layer 11 can be obtained by specific gravity measurement (Archimedes' method). When an opaque quartz glass piece of unit volume (1 cm$^3$) is cut out from a crucible and the mass thereof is referred to as A, and the specific gravity of the quartz glass with no bubbles contained therein (true density of quartz glass) is referred to as B=2.2 g/cm$^3$, the bubble content P (%) is P=(B−A)/B×100.

The inner transparent layer 12A is a layer forming an inner surface 10a of the crucible wall which is in contact with the silicon melt, and is provided in order to, if bubbles are contained, prevent dislocation of a single crystal due to crucible fragments and the like when the bubbles burst. Furthermore, in order to prevent contamination of the silicon melt, the inner transparent layer 12A is also required to be highly pure. The thickness of the inner transparent layer 12A is preferably 0.5 to 10 mm, and is set to an appropriate thickness for each part of the crucible so as not to cause the opaque layer 11 to be exposed due to the inner transparent layer 12A being completely removed by erosion during a single crystal pull-up step. Similar to the opaque layer 11, it is preferable that the inner transparent layer 12A is provided over the entire crucible from the straight body portion 1a to the bottom portion 1b of the crucible. However, in the upper end portion (rim portion) of the crucible which is not in contact with the silicon melt, it is also possible to omit formation of the inner transparent layer 12A.

"With substantially no bubbles contained" in the inner transparent layer 12A means a bubble content and a bubble size at which the single crystallinity is not decreased by crucible fragments when bubbles burst, and means that the bubble content is 0.8% or less and the average diameter of the bubbles is 100 µm or less. A change in the bubble content at the boundary between the opaque layer 11 and the inner transparent layer 12A is steep, and the boundary between the two is apparent with the naked eye.

The outer transparent layer 12B is a layer forming an outer surface 10b of the crucible wall which comes in contact with the inner surface of a graphite crucible that supports the crucible during the crystal pull-up step. The outer transparent layer 12B is provided to avoid deformation of the crucible caused by foaming and delamination which occurs, when the outer surface 10b of the crucible is crystallized and a crystallized layer is formed, in the vicinity of the interface between the crystallized layer and the glass layer.

Although the thickness of the outer transparent layer 12B slightly varies depending on its part, the thickness is preferably 1 to 7 mm, and particularly preferably 3 to 5 mm. The outer transparent layer 12B is set to have a sufficient thickness for each portion of the crucible so that the thickness of the crystallized layer formed in the outer surface 10b of the crucible does not exceed the thickness of the outer transparent layer 12B.

"With substantially no bubbles contained" in the outer transparent layer 12B means a bubble content and a bubble size at which foaming and delamination does not occur in the vicinity of the interface between the crystallized layer and the glass layer due to cohesion and expansion of the bubbles, and means that the bubble content is 2.1% or less and the average diameter of the bubbles is 100 µm or less. A change in the bubble content at the boundary between the opaque layer 11 and the outer transparent layer 12B is steep, and the boundary between the two is apparent with the naked eye.

The bubble contents of the inner transparent layer 12A and the outer transparent layer 12B can be measured non-destructively using optical detecting means. The optical detecting means includes a light receiving device which receives the reflected light of the light irradiating the inner surface of a crucible to be inspected. Irradiation light emitting means may be built in or external light emitting means may also be used. In addition, as the optical detecting means, one that can be turned along the inner surface of the crucible is preferably used. As the irradiation light, X-rays, laser light, and the like as well as visible light, ultraviolet light, and infrared light can be used, and any light can be applied as long as the light can be reflected for bubble detection. The light receiving device is selected according to the type of the irradiation light, and for example, an optical camera including a light receiving lens and an imaging unit can be used.

Measurement results by the optical detecting means are received by an image processing device to calculate the bubble content. Specifically, an image of the inner surface of the crucible is taken using the optical camera, the inner surface of the crucible is divided into predetermined areas as reference areas S1, an area S2 occupied by bubbles is obtained for each reference area S1, and the bubble content P (%) is calculated by P=(S2/S1)×100. In order to detect bubbles present at a constant depth from the surface of quartz glass, the focal point of a light receiving lens may be scanned in a depth direction from the surface. A plurality of images is taken in this manner, and the bubble content in a space may be obtained on the basis of the bubble content of each of the images.

In the surface layer portion of the outer surface 10b of the quartz glass crucible 1 according to the embodiment, a high-aluminum-content layer 14B made of quartz glass with a relatively high average aluminum concentration is provided. The high-aluminum-content layer 14B plays a role in accelerating crystallization of the outer surface 10b of the crucible wall at a high temperature during a step of pulling up a silicon single crystal. The inner side of the high-aluminum-content layer 14B is a low-aluminum-content layer 14A made of quartz glass having a lower average aluminum concentration than that in the high-aluminum-content layer 14B. The high-aluminum-content layer 14B needs to be provided in at least the straight body portion 1a of the crucible, and is preferably provided in the straight body portion 1a and the corner portion 1c. This is because, in the straight body portion 1a, the pressure from the inside disappears after the pull-up of the silicon single crystal proceeds and the melt surface is lowered, with the result that collapse to the inside easily occurs, and in the corner portion, the weight of the crucible straight body portion is applied from above, with the result that the crucible wall is easily deformed into a shape that protrudes inward.

The low-aluminum-content layer 14A is a quartz glass layer formed by using quartz powder having a low aluminum concentration as a raw material, and the average aluminum concentration thereof is less than 20 ppm. On the other hand, the high-aluminum-content layer 14B is a quartz glass layer formed by using natural quartz powder (aluminum-added quartz powder) having aluminum is added thereto as a raw material, and the average aluminum concentration thereof is 20 ppm or more, and is preferably ppm or more. That is, the average aluminum concentration of the high-aluminum-content layer 14B is preferably higher than that of the low-aluminum-content layer 14A by 10 ppm or more.

A synthetic quartz glass layer made of synthetic quartz powder as a raw material is preferably formed in the surface layer portion of the inner surface 10a of the quartz glass crucible 1. That is, the low-aluminum-content layer 14A preferably has a two-layer structure of a natural quartz glass layer made of natural quartz powder having a lower aluminum concentration than that of aluminum-added quartz powder as a raw material, and the synthetic quartz glass layer. The synthetic quartz glass layer is preferably set to have a sufficient thickness so as not to cause the natural quartz glass layer to be exposed due to the synthetic quartz glass layer being completely removed by erosion.

The thickness of the high-aluminum-content layer 14B is 2 to 3 mm, which is smaller than the thickness of the outer transparent layer 12B, and is included in a formation region of the outer transparent layer 12B. That is, the high-aluminum-content layer 14B is made of transparent quartz glass with substantially no bubbles contained therein. The bubble content of the high-aluminum-content layer 14B is substantially equal to the bubble content of the entire outer transparent layer 12B including the high-aluminum-content layer 14B, and is preferably 0.8% or less. When the aluminum concentration of quartz glass is high, the crystallization rate of the quartz glass is fast, and bubbles are likely to remain and cohere in crystals, thereby allowing foaming and delamination to easily occur. However, since the high-aluminum-content layer 14B is a part of the outer transparent layer 12B, the crystallized layer is formed from only quartz glass having a low gas content being crystallized, so that bubbles do not remain and cohere in crystals. Therefore, even when the crystallized layer grows and increases in thickness, foaming and delamination in the vicinity of the interface between the crystallized layer and the glass layer can be prevented.

The probability of foaming and delamination increases as the temperature during the pull-up step increases even if the bubble content in the quartz glass forming the high-aluminum-content layer 14B is constant, and increases as the aluminum concentration increases. Therefore, for example, in a case where the temperature during the pull-up step is set to a relatively high temperature and the average aluminum concentration in the high-aluminum-content layer 14B is set to be high, it is preferable that the bubble content of the high-aluminum-content layer 14B is further reduced.

When the temperature increases during the pull-up step or the aluminum concentration increases, the crystallization rate of the high-aluminum-content layer increases. Therefore, when bubbles are contained in the quartz glass layer, the time for diffusion of gas with no bubbles into the crucible wall is reduced, and as a result, the amount of bubbles remaining at the interface between the crystallized layer and the quartz glass layer before being crystallized increases. Accordingly, it is preferable to reduce the bubble content in the high-aluminum-content layer 14B as much as possible.

Specifically, assuming that X is the bubble content (%) and Y is the total concentration (ppm) of alkali metals, Ba, Sr, Al, and Ca, foaming and delamination can be prevented by satisfying the relational expression $Y < -140X + 310$. Here, foaming and delamination means a phenomenon in which a crystallized layer and a quartz glass layer which is not crystallized are separated from each other and the layer which is not crystallized and has low strength (viscosity) swells.

Figure 2:
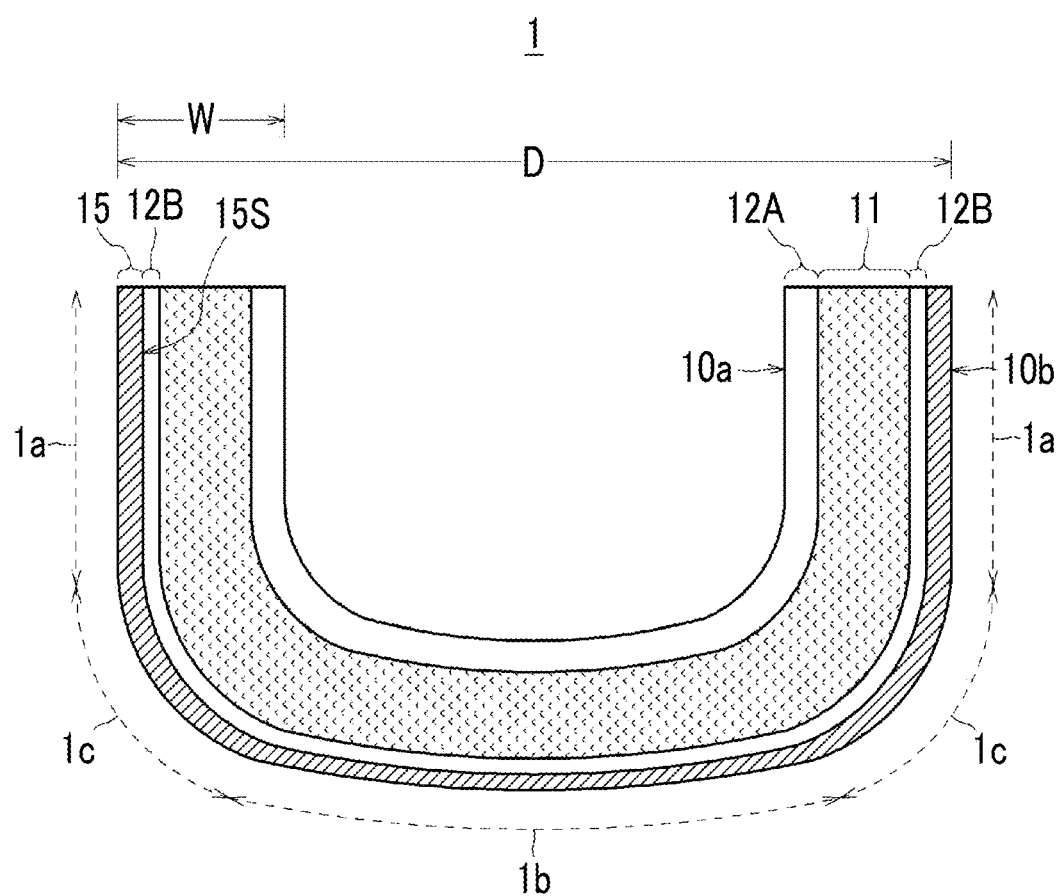
FIG. 2 is a schematic cross-sectional view illustrating the structure of a quartz glass crucible 1 in a state in which an outer surface 10b is crystallized by heating.

FIG. 2 is a schematic cross-sectional view illustrating the structure of the quartz glass crucible 1 in a state in which the outer surface 10b is crystallized by heating.

As illustrated in FIG. 2, the crystallization of the outer surface 10b of the quartz glass crucible 1 provided with the high-aluminum-content layer 14B is accelerated by heating to 1400° C. or higher during the step of pulling up the single crystal, and accordingly, a crystallized layer 15 is formed. By crystallizing the surface layer portion of the outer surface 10b of the crucible as described above, the strength of the crucible can be increased, and deformation of the crucible such as buckling and collapse to the inside can be suppressed.

Although the thickness of the crystallized layer 15 varies depending on the part of the crucible, the thickness needs to be 200 μm or more, and is preferably 400 μm or more. This is because, when the thickness is less than 200 μm, the effect of improving the strength of the crucible by providing the crystallized layer 15 is not obtained. When the thickness of the crystallized layer 15 is 400 μm or more, the strength of the crucible can be reliably improved. On the other hand, when the crystallized layer 15 becomes too thick, bubbles are likely to cohere and expand at an interface 15S between the crystallized layer 15 and the quartz glass layer. Therefore, the thickness of the crystallized layer 15 needs to be an appropriate thickness, and is preferably 5 mm or less at the maximum, and more preferably 2 mm or less. The thickness of the crystallized layer 15 is substantially the same as or slightly thicker than the thickness of the high-aluminum-content layer 14B, the thickness of the crystallized layer 15 can be easily controlled by setting the high-aluminum-content layer 14B to have an appropriate thickness.

Figure 3:
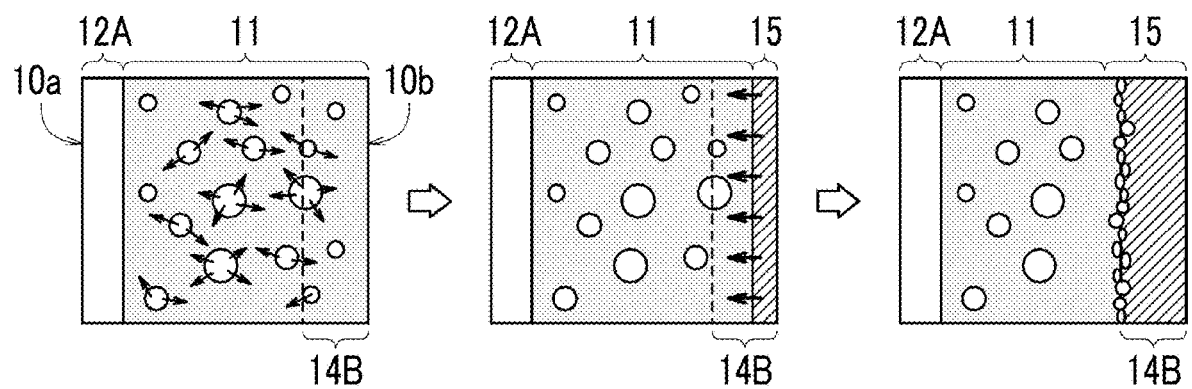
FIG. 3 is a schematic view for explaining a mechanism of foaming and delamination in the vicinity of the interface between a crystallized layer 15 and a glass layer on the inner side thereof, in which (a) to (c) represent a case of a quartz glass crucible having a two-layer structure in the related art, and (d) to (f) represent a case of a quartz glass crucible having a three-layer structure according to the present invention.
Figure 3:
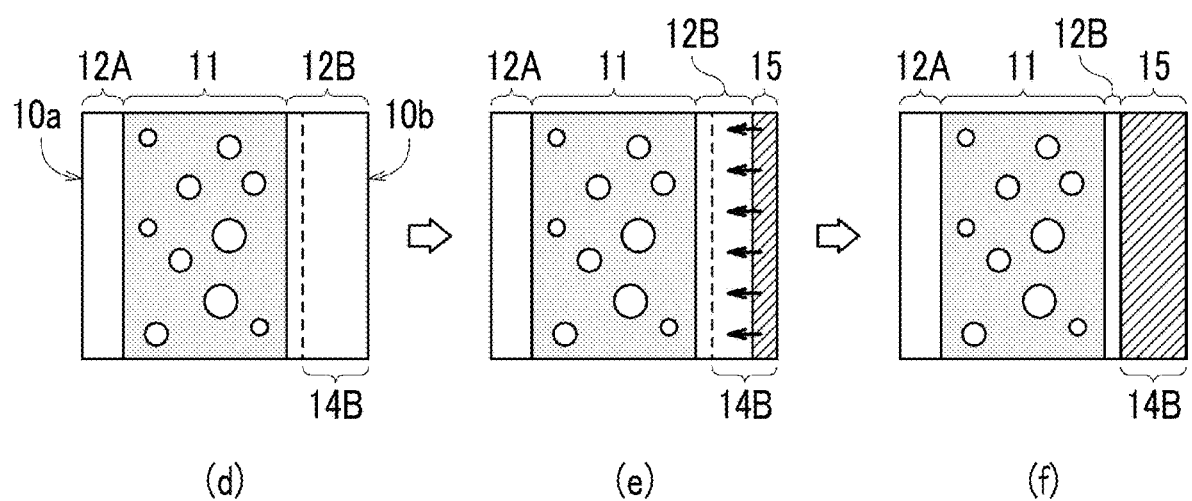

FIG. 3 is a schematic view for explaining a mechanism of foaming and delamination in the vicinity of the interface between the crystallized layer 15 and the glass layer on the inner side thereof, in which (a) to (c) represent a case of a quartz glass crucible having a two-layer structure in the related art, and (d) to (f) represent a case of the quartz glass crucible having a three-layer structure according to the embodiment.

As illustrated in FIG. 3(a), in the case of the quartz glass crucible in the related art, which has a two-layer structure consisting of only the inner transparent layer 12A and the opaque layer (bubble layer) 11, the high-aluminum-content layer 14B is provided in the opaque layer 11, so that the crystallized layer 15 is formed by melting and crystallizing quartz glass containing a large number of bubbles.

As illustrated in FIG. 3(b), the crystallization of the opaque layer 11 proceeds from the outer surface 10b side of the crucible toward the inner surface 10a side, and when the quartz glass containing bubbles therein is crystallized, the bubbles in the glass or gas components incorporated into the glass are discharged from the crystallized layer 15 and are incorporated into the quartz glass layer (the opaque layer 11) side which is not melted, as indicated by leftward arrows. In particular, since the bubbles in the opaque layer 11 serve as a tank for supplying gas into the glass, in a case where the opaque layer 11 is crystallized, the gas is more likely to be transferred from the crystallized layer 15 toward the glass layer.

As the crystallized layer 15 grows thicker and thicker, the amount of gas to be dissolved as a solid solution into the quartz glass layer which is not melted increases. When the glass layer cannot accept the solid solution of the gas, as illustrated in FIG. 3(c), a large amount of bubbles are generated in the vicinity of the interface between the crystallized layer 15 and the glass layer, and the probability of foaming and delamination increases.

On the other hand, as illustrated in FIG. 3(d), in the case of the quartz glass crucible having a three-layer structure including the inner transparent layer 12A, the opaque layer (bubble layer) 11, and the outer transparent layer 12B, since the high-aluminum-content layer 14B is provided in the outer transparent layer 12B, the crystallized layer 15 is formed by melting and crystallizing the quartz glass with no bubbles therein.

As illustrated in FIG. 3(e), although the crystallization of the outer transparent layer 12B proceeds from the outer surface 10b side of the crucible toward the inner surface 10a side, bubbles and gas components are not discharged even when the quartz glass with no bubbles contained therein is crystallized. Therefore, the gas components are not incorporated into the quartz glass layer (the opaque layer 11) side which is not melted.

Therefore, as illustrated in FIG. 3(f), even when the crystallized layer 15 becomes thick, foaming and delamination does not occur at the interface between the crystallized layer 15 and the glass layer. As described above, by making the crystallized region of the outer surface 10b side of the crucible a bubble-free layer to remove the main cause of foaming (gas supply source), the probability of the foaming and delamination can be significantly reduced.

Foaming and delamination in the vicinity of the interface between the crystallized layer and the glass layer can also be caused by nitrogen and moisture as well as impurity components such as carbon and sulfur dissolved in the glass. Therefore, it is possible to further reduce the probability of the occurrence of foaming and delamination by excluding gas components dissolved in the glass as a solid solution as much as possible.

The concentrations of carbon and sulfur contained in the high-aluminum-content layer 14B are preferably as low as possible, and it is particularly preferable that the average concentration of each of carbon and sulfur in the high-aluminum-content layer 14B is 5 ppm or less. Although details will be described later, impurity components derived from carbon, sulfur, and other manufacturing processes are adhered to the aluminum-added quartz powder which is the raw material of the high-aluminum-content layer 14B, and in a case where the high-aluminum-content layer 14B is formed by using the aluminum-added quartz powder, the impurity concentration in the high-aluminum-content layer 14B increases. When the impurity concentration in the high-aluminum-content layer 14B is high, even if the high-aluminum-content layer 14B is formed in the outer transparent layer 12B, the impurities cause the generation of gas, and the bubble content in the crystallized layer cannot be sufficiently reduced when the high-aluminum-content layer 14B is crystallized.

However, in a case where gas components such as carbon adhered to the aluminum-added quartz powder are removed in advance and thus the carbon concentration in the high-aluminum-content layer 14B is suppressed to be low, the bubble content in the high-aluminum-content layer 14B can be suppressed to be less than 0.5%, so that the probability of the generation of bubbles when the high-aluminum-content layer 14B is crystallized during pulling up a silicon single crystal can be further reduced. Therefore, the probability of deformation of the crucible caused by foaming and delamination in the vicinity of the interface between the crystallized layer and the glass layer due to cohesion and expansion of the bubbles can be further reduced.

As the aluminum concentration in the high-aluminum-content layer 14B increases, the crystallization of the quartz glass can be accelerated. However, the high concentration of aluminum does not necessarily contribute to the suppression of the deformation of the crucible. This is because when the aluminum concentration is made very high, the viscosity of the quartz glass tends to decrease.

Figure 4:
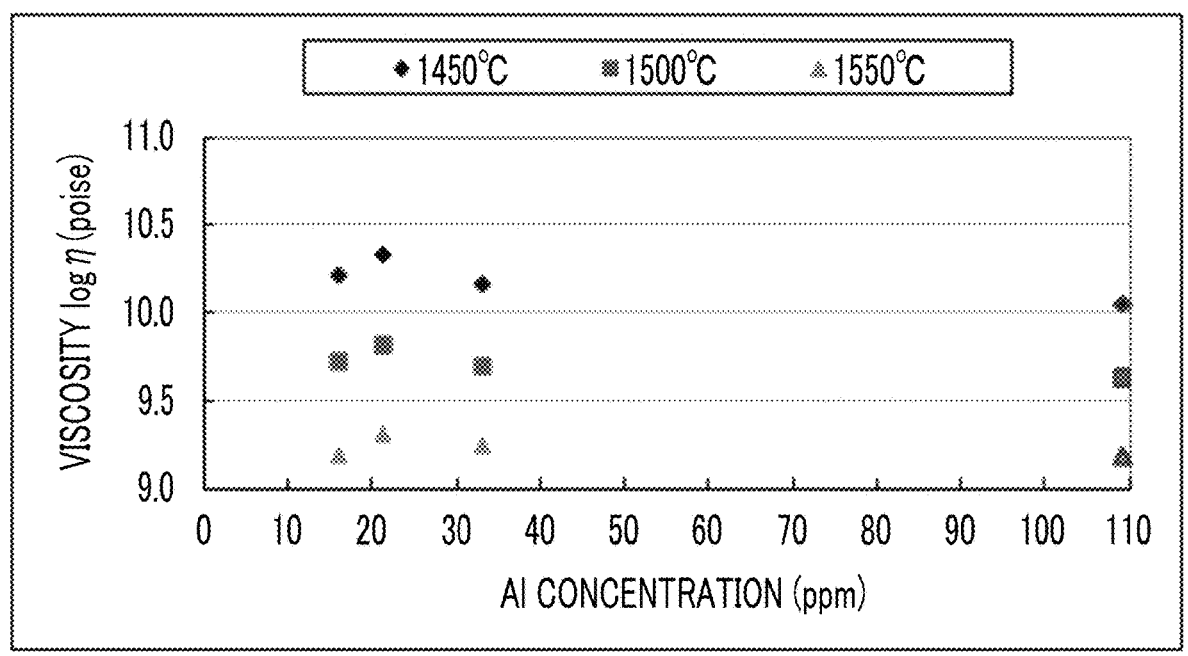
FIG. 4 is a graph illustrating the relationship between the aluminum concentration and the viscosity at a high temperature of 1450° C. of quartz glass, in which the horizontal axis represents the aluminum concentration (ppm) and the vertical axis represents the viscosity logo (poise)).

FIG. 4 is a graph illustrating the relationship between the aluminum concentration and the viscosity at a high temperature of 1450° C. of the quartz glass, in which the horizontal axis represents the aluminum concentration (ppm) and the vertical axis represents the viscosity logo (poise).

In FIG. 4, the aluminum concentration of quartz glass using natural quartz powder having no aluminum added thereto is about 16 ppm, and the viscosity thereof at 1450° C. is 10.2 poise, with the result that the viscosity decreases as the temperature increases. Contrary to this, the aluminum concentration of quartz glass using natural quartz powder to which about 5 ppm of aluminum is additionally added is 21 ppm, and the viscosity thereof at 1450° C. is about 10.3 poise. Also, the aluminum concentration of quartz glass using natural quartz powder to which about 12 ppm of aluminum is additionally added is 33 ppm, and the viscosity thereof at 1450° C. is about 10.15 poise. The viscosity of quartz glass using natural quartz powder to which aluminum is added at a concentration as high as about 109 ppm further decreases, and the viscosity thereof at 1450° C. is about 10.0 poise.

As described above, although the viscosity of quartz glass to which aluminum is slightly added can be increased compared to one with no aluminum added, the viscosity of quartz glass is not increased with an increase in the aluminum concentration, but rather tends to decrease.

As described above, the high-aluminum-content layer 14B is less likely to deform at a high temperature once crystallized and thus can obtain sufficient durability. Therefore, the crystallization rate can be increased as the aluminum concentration increases. However, when the aluminum concentration is high before crystallization, the viscosity of quartz glass decreases, and there is a problem that the crucible easily deforms.

Therefore, the high-aluminum-content layer 14B according to the embodiment preferably has a distribution in which a region with a high aluminum concentration and a region with a low aluminum concentration coexist when viewed at a microscopic scale of around 1 mm$^3$. While the region with a high aluminum concentration accelerates the crystallization of the quartz glass, the region with a low aluminum concentration secures the viscosity of the quartz glass and plays a role of withstanding deformation until the high-aluminum-content layer 14B is sufficiently crystallized. A part with a high aluminum concentration is preferably present in a mesh form within a region of about 1 mm$^3$. The aluminum concentration of the region with a high aluminum concentration in the high-aluminum-content layer 14B is preferably 60 ppm or more, and is more preferably 300 ppm or more. In addition, the concentration of the region with a low aluminum concentration in the high-aluminum-content layer 14B is preferably less than 25 ppm, and is more preferably less than 20 ppm. Furthermore, the aluminum concentration gradient between the region with a high aluminum concentration and the region with a low aluminum concentration is preferably 1 ppm/μm or more and 100 ppm/μm or less, and more preferably 1 ppm/μm or more and 10 ppm/μm or less.

In a case where aluminum is unevenly distributed, the formation of crystal nuclei starts from a point aluminum is present at a high concentration, and glass which is present in the periphery thereof and thus has low viscosity is easily crystallized. Therefore, compared to a case aluminum is uniformly distributed, the time needed until the crystallized layer 15 reaches a desired thickness is short. During the period until the quartz glass is crystallized, the region with a low aluminum concentration can withstand deformation with the viscosity of the quartz glass itself. Therefore, both the acceleration of crystallization and the improvement in the strength of the crucible can be achieved.

The uneven distribution of aluminum in the high-aluminum-content layer 14B is attributed to the state of adhesion of aluminum contained in aluminum-added quartz powder as the raw material to quartz particles. The maximum size of a single aluminum-containing quartz particle is 300 to 400 μm, and aluminum is concentrated in the vicinity of the surfaces of individual quartz particles. When such aluminum-added quartz powder is subjected to arc melting and is vitrified, aluminum hardly diffuses into quartz glass in a short time of 10 to 15 minutes during the arc melting, so that a quartz glass layer in which a high aluminum concentration region and a low aluminum concentration microscopically coexist can be formed.

Figure 5:
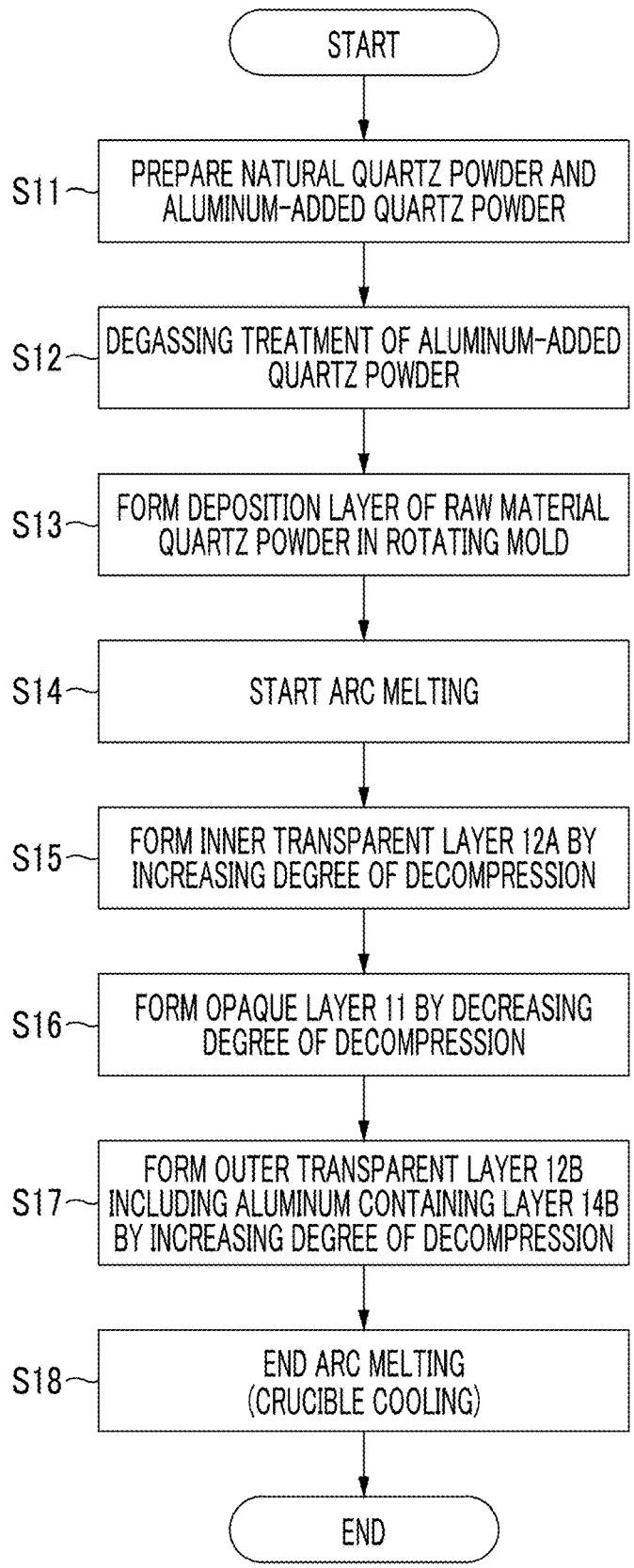
FIG. 5 is a flowchart schematically illustrating a manufacturing method of the quartz glass crucible 1 according to the embodiment.

FIG. 5 is a flowchart schematically illustrating a manufacturing method of the quartz glass crucible 1 according to the embodiment. In addition, FIG. 6 is a view for explaining a manufacturing method of a crucible according to a rotating mold method, in which (a) is a side view schematically illustrating the configuration of a mold, and (b) is a schematic view for explaining the state of bubbles in quartz glass depending on the presence or absence of decompression melting.

As illustrated in FIG. 5, to manufacture the quartz glass crucible 1, first, natural quartz powder and aluminum-added quartz powder to which aluminum is added are prepared as raw material quartz powder (step S11). As a raw material for the inner transparent layer 12A, high-purity synthetic quartz powder may be further prepared.

The "aluminum-added quartz powder" refers to one in which aluminum is intentionally added to quartz powder having a low aluminum concentration, and the "natural quartz powder" refers to typical natural quartz powder to which aluminum is intentionally not added. In general, natural quartz powder contains a trace amount of various metal impurities such as aluminum and alkali metals. However, for example, the average aluminum concentration thereof is less than 20 ppm, and such natural quartz powder is distinguished from the aluminum-added quartz powder. In order to define aluminum-added quartz powder, it is necessary that the average aluminum concentration thereof is 30 ppm or more. The average particle size of the aluminum-added quartz powder is 100 to 400 μm, preferably 200 to 400 μm, and more preferably 300 to 400 μm. It is preferable that the aluminum concentration of the top surface of the aluminum-added quartz powder is 60 ppm or more, and the aluminum concentration of the center portion of the aluminum-added quartz powder is less than 25 ppm.

The aluminum-added quartz powder can be produced by mixing an aluminum compound such as aluminum alkoxide or aluminum sulfide in typical natural quartz powder having an average particle size of 100 to 400 μm, and thereafter performing a heat treatment (first heat treatment step) thereon in a non-oxygen atmosphere at 1000 to 1200° C. for five hours or more. Aluminum does not diffuse in a short time of 10 to 15 minutes during the arc melting. However, aluminum diffuses during a heating time of several hours to several tens of hours for producing aluminum-added quartz powder. Therefore, aluminum can be allowed to penetrate into the surface layer portion of the quartz powder. However, if the heating time is too long, aluminum may penetrate into the quartz powder to an excessive extent that a distribution in which aluminum is concentrated on the top surface is not achieved. Therefore, the heating time is suitably 2 to 20 hours, and particularly preferably 5 to 10 hours. The reason why the heat treatment is performed in the non-oxygen atmosphere is to prevent oxidation of the aluminum compound. When the heat treatment is performed in an oxygen atmosphere, the aluminum compound turns into alumina, and since alumina and quartz hardly react with each other, aluminum cannot be allowed to penetrate into quartz powder.

The aluminum-added quartz powder produced in the method described above contains impurities derived from a manufacturing process, such as carbon and sulfur, and when such impurities adhere to quartz particles, this causes the generation of bubbles. Therefore, in the embodiment, a degassing treatment (pretreatment) for removing impurity components from the aluminum-added quartz powder is performed (step S12).

In the degassing treatment, first, the aluminum-added quartz powder is set in a chamber, the inside of the chamber is set to an air atmosphere at 1 atm (normal pressure), is increased in temperature to 1000 to 1200° C., and is held at a temperature at which the quartz powder is not sintered, for 5 to 10 hours. By this heat treatment (second heat treatment step), impurity components such as carbon and sulfur adhered the aluminum-added quartz powder are removed. The impurity components which cause the generation of bubbles can be further reduced as the high temperature maintenance time increases. However, since aluminum penetrates into the inside of quartz particles, it is not preferable that the high temperature maintenance time is set to be very long, and a time of 2 to 20 hours is appropriate. The temperature of the degassing treatment is set to 1000 to 1200° C. because, when the temperature of the heat treatment is high, the quartz powder is sintered and gas is trapped inside the quartz powder and becomes bubbles. When a crucible is manufactured by using quartz powder containing bubbles therein, the bubbles remain in a quartz glass layer. However, in a case where a heat treatment is performed in a temperature range in which quartz powder is not sintered, it is possible to prevent bubbles from remaining.

Next, the inside of the chamber is evacuated, and the aluminum-added quartz powder is held in a vacuum for a predetermined time (first holding step). In a case where the heat treatment is performed in an atmosphere at atmospheric pressure, nitrogen is diffused in quartz powder. Therefore, nitrogen can be removed by reducing the pressure from 1 atm to a vacuum atmosphere and holding the pressure, for example, for five hours. The nitrogen-rich quartz powder generates a large amount of bubbles in the quartz powder melting step. However, by removing the nitrogen, the generation of bubbles can be suppressed.

Thereafter, the inside of the chamber is changed to a helium atmosphere at 1 atm, and the aluminum-added quartz powder is held in the helium atmosphere at normal pressure for a predetermined time (second holding step). By holding the aluminum-added quartz powder in the helium atmosphere, gas components, carbon, nitrogen, and the like adhered to and remaining on the surface of the aluminum-added quartz powder can be replaced with helium, which is inert and has a high diffusion rate. Helium is a smaller atom than nitrogen and thus diffuses very quickly in glass. Therefore, even though a slight amount of bubbles are generated in the quartz powder melting step, helium gas easily diffuses in the glass, so that the bubbles disappear. Accordingly, even though crystallization proceeds to a quartz glass layer made of quartz powder having no aluminum added thereto, foaming and delamination can be prevented.

By the above-described treatments, the impurity components such as carbon, sulfur, and nitrogen, which are the potential cause of bubbles, are removed in advance, so that foaming and delamination in the vicinity of the interface between the crystallized layer and the glass layer can be prevented when the outer surface of the crucible is crystallized, which in turn improves the strength of the crucible.

It is also preferable that the degassing treatment is performed not only on the aluminum-added quartz powder but also on typical natural quartz powder having no aluminum added thereto. In particular, by performing the degassing treatment even on quartz powder disposed inside the aluminum-added quartz powder, moisture (OH group) adhered to the quartz powder can be released, so that foaming and delamination can be prevented even when crystallization proceeds to the quartz glass layer made of quartz powder having no aluminum added thereto.

In the aluminum addition treatment described above, it is preferable that the aluminum concentration distribution in the high-aluminum-content layer of the quartz glass crucible is measured by secondary ion mass spectrometry, and on the basis of the measurement results of the aluminum concentration distribution, the concentration of a solution containing an aluminum compound used for manufacturing a subsequent quartz glass crucible, or a heat treatment time or a heat treatment temperature for the aluminum-added quartz powder are adjusted. As described above, aluminum-added quartz powder suitable for forming an aluminum containing layer can be prepared.

Figure 6A:
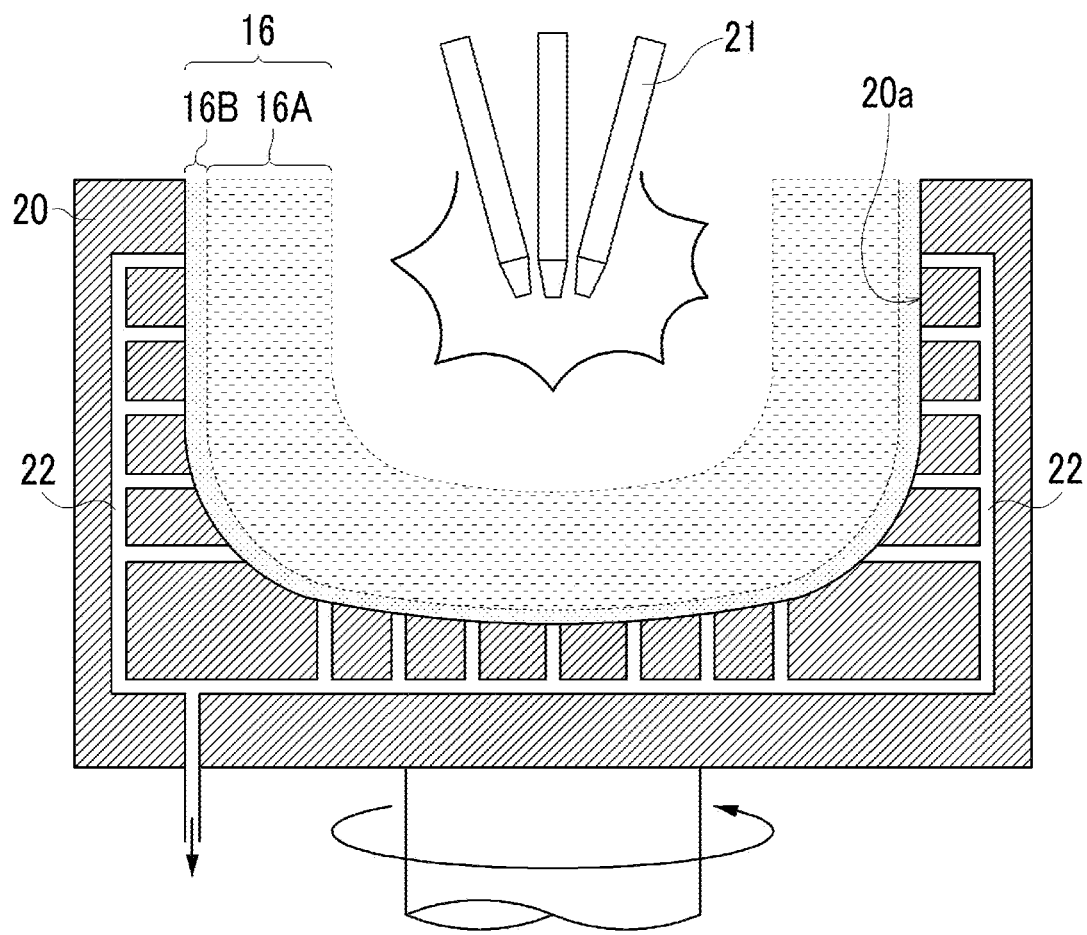
FIG. 6 is a view for explaining a manufacturing method of a crucible according to a rotating mold method, in which (a) is a side view schematically illustrating the configuration of a mold, and (b) is a schematic view for explaining the state of bubbles in quartz glass depending on the presence or absence of decompression melting.

Next, the quartz glass crucible is manufactured by the rotating mold method using the raw material quartz powder. As illustrated in FIG. 6(a), in the manufacturing of the quartz glass crucible according to the rotating mold method, aluminum-added quartz powder 16B and natural quartz powder 16A are sequentially deposited on an inner surface 20a of a rotating mold 20 such that a deposition layer 16 of the raw material quartz powder is formed (step S13). In a case where synthetic quartz powder is used as the raw material of the inner transparent layer 12A, the synthetic quartz powder may be deposited on the natural quartz powder 16A. The raw material quartz powder 16 is retained at a certain position as it is attached to the inner surface 20a of the mold 20 by the centrifugal force and maintained in that shape.

Next, an arc electrode is placed in the mold, and the deposition layer 16 of the raw material quartz powder is subjected to arc melting from the inner surface 20a side of the mold 20 (step S14). Specific conditions such as a heating time and a heating temperature can be appropriately determined in consideration of conditions such as the raw material and the size of the crucible. Here, the amount of bubbles in the melted quartz glass is controlled by evacuating the deposition layer 16 of the raw material quartz powder through a number of vent holes 22 provided in the inner surface 20a of the mold 20.

Specifically, the inner transparent layer 12A is formed by strengthening the degree of decompression through a large number of vent holes 22 provided in the inner surface 20a of the mold 20 at the time of the start of arc melting (step S15), the opaque layer 11 is formed by weakening the degree of decompression after forming the inner transparent layer 12A (step S16), and the outer transparent layer 12B is formed by strengthening the degree of decompression after forming the opaque layer 11 (step S17). In particular, when the outer transparent layer 12B is formed, the timing at which decompression melting is resumed is controlled so that the thickness of the outer transparent layer 12B becomes thicker than the high-aluminum-content layer 14B formed by melting the deposition layer of the aluminum-added quartz powder 16B. In a case of forming the inner transparent layer 12A and the outer transparent layer 12B, the strength of the decompression force is preferably −70 to −95 kPa. In addition, in a case of forming the opaque layer 11 which is a bubble containing layer, the strength of the decompression force is preferably substantially atmospheric pressure to −35 kPa.

Figure 6B:
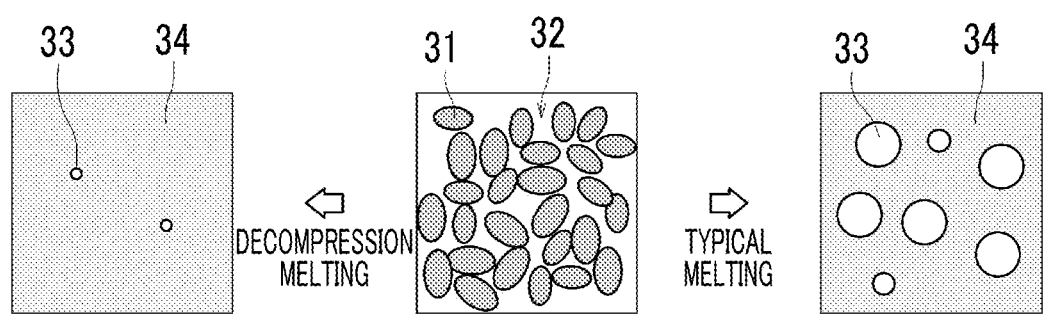

Arc heat is gradually transferred from the inside to the outside of the deposition layer 16 of the raw material quartz powder to melt the raw material quartz powder. Therefore, by changing decompression conditions at the timing at which the raw material quartz powder starts to melt, a transparent layer and an opaque layer can be separately formed. That is, as illustrated in FIG. 6(b), when decompression melting for strengthening the degree of decompression is performed at the timing at which quartz powder 31 melts, arc atmosphere gas 32 is not trapped in glass, and as illustrated in the left figure, quartz glass 34 containing substantially no bubbles 33 is formed. In addition, when typical melting (atmospheric pressure melting) for decreasing the degree of compression is performed at the timing at which the quartz powder 31 melts, the arc atmosphere gas 32 is trapped in the glass, and as illustrated in the right figure, quartz glass 34 containing a large amount of the bubbles 33 is formed.

Thereafter, the arc melting is ended, and the crucible is cooled (step S18). As described above, the quartz glass crucible 1 in which the inner transparent layer 12A, the opaque layer 11, and the outer transparent layer 12B are provided in this order from the inner side toward the outer side of the crucible wall is completed.

As described above, in the quartz glass crucible 1 according to the embodiment, since the high-aluminum-content layer 14B is provided on the outer surface 10b side of the crucible and no bubbles are present in the high-aluminum-content layer 14B, even when the high-aluminum-content layer 14B is crystallized and the crystallization proceeds toward the inside of the crucible, cohesion and expansion of the bubbles does not occur in the vicinity of the interface between the crystallized layer 15 and the glass layer, with the result that deformation of the crucible can be prevented. In addition, since the crystallized layer with no bubbles contained therein is formed, the crystallized layer in which cracks are less likely to occur can be realized. Therefore, it is possible to withstand a single crystal pull-up step taken for a very long period of time, such as multi-pulling.

In the embodiment, since the region having a high aluminum concentration and the region having a low aluminum concentration are microscopically unevenly distributed in the high-aluminum-content layer 14B, crystallization of quartz glass can be accelerated in the region having a high aluminum concentration, while in the region having a low aluminum concentration, the viscosity of the quartz glass is increased and thus deformation of the crucible can be prevented until the high-aluminum-content layer 14B is crystallized. In addition, even when the temperature is not held for a predetermined time at a temperature for the formation of crystal nuclei during pulling up a single crystal due to the rapid proceeding of the crystallization, the strength of the crucible can be secured from the initial state of the pull-up, so that the strength of the crucible can be further increased as the crystallization further proceeds.

Furthermore, in the embodiment, when the quartz glass crucible is manufactured by the rotating mold method using the aluminum-added quartz powder, impurity components derived from carbon and sulfur adhered to the aluminum-added quartz powder and other manufacturing processes are removed in advance, and thus the average concentration of each of carbon and sulfur in the high-aluminum-content layer 14B of the quartz glass crucible is suppressed to be 5 ppm or less, thereby removing the potential cause of bubbles in advance. Therefore, the probability of deformation of the crucible caused by foaming and delamination due to cohesion and expansion of bubbles in the vicinity of the interface between the crystallized layer and the glass layer when the outer surface of the crucible is crystallized can be further reduced.

In addition, in the manufacturing method of the quartz glass crucible 1 according to the embodiment, since the outer transparent layer 12B which is thicker than the high-aluminum-content layer 14B is formed by strengthening the degree of decompression when the aluminum-added quartz powder deposited on the inner surface of the rotating mold is melted, the outer transparent layer 12B including the high-aluminum-content layer 14B containing substantially no bubbles can be reliably and easily formed. Therefore, the quartz glass crucible in which deformation due to foaming and delamination in the vicinity of the interface between the crystallized layer and the glass layer is less likely to occur can be manufactured.

In addition, in the embodiment, the average particle size of the aluminum-added quartz powder used for forming the high-aluminum-content layer 14B is 300 to 400 μm, the aluminum concentration of the top surface of each of the particles of the aluminum-added quartz powder is 60 ppm or more, and the aluminum concentration of the center portion of each of the particles is less than 25 ppm. Therefore, the region having a high aluminum concentration and the region having a low aluminum concentration can be distributed unevenly in the high-aluminum-content layer 14B. Accordingly, the effect of accelerating crystallization of the high-aluminum-content layer 14B and the effect of suppressing deformation of the crucible by improving the viscosity of the quartz glass can be improved.

Furthermore, in the embodiment, before filling the mold with the aluminum-added quartz powder, impurity components derived from carbon and sulfur adhered to the aluminum-added quartz powder and other manufacturing processes are removed in advance. Therefore, components which are the cause of generation of bubbles, such as carbon adhered to the aluminum-added quartz powder, can be removed in advance. Accordingly, the probability of the generation of bubbles when the high-aluminum-content layer 14B is crystallized in the step of pulling up a single crystal can be further reduced. Therefore, the probability of deformation of the crucible caused by foaming and delamination in the vicinity of the interface between the crystallized layer and the glass layer due to cohesion and expansion of the bubbles can be further reduced.

While the preferred embodiments of the present invention have been explained above, the present invention is not limited to the embodiments and may be variously modified without departing from the scope of the present invention. Accordingly, all such modifications are included in the present invention.

For example, in the embodiment, the case where the high-aluminum-content layer 14B having a microscopically uneven aluminum concentration distribution is provided in the outer transparent layer 12B with no bubbles contained therein is exemplified. However, in the crucible having a two-layer structure consisting of the opaque layer 11 and the inner transparent layer 12A in the related art, the high-aluminum-content layer 14B may be formed in the opaque layer 11. That is, the high-aluminum-content layer 14B having a microscopically uneven aluminum concentration distribution may be made of quartz glass containing a large number of bubbles.

In addition, in the embodiment, in the manufacturing method of the quartz glass crucible having the high-aluminum-content layer 14B with no bubbles contained therein, the case where the step of removing impurity components derived from carbon and sulfur adhered to the aluminum-added quartz powder and other manufacturing processes is adopted has been described. However, the present invention is not limited to such a case, and in the manufacturing method of the quartz glass crucible having the high-aluminum-content layer 14B containing bubbles, a step of removing impurity components such as carbon adhered to the aluminum-added quartz powder may be adopted.

EXAMPLE

A quartz glass crucible was manufactured by a rotating mold method, and a foaming test was conducted thereon to evaluate the presence or absence of foaming and delamination. As the raw material quartz powder of the quartz glass crucible, natural quartz powder and aluminum-added quartz powder were prepared. The average particle size of the natural quartz powder was about 400 μm, and the average aluminum concentration thereof in a state of being dissolved in hydrofluoric acid was 20 ppm.

The aluminum-added quartz powder was produced by performing a treatment of adding aluminum to the natural quartz powder. In the aluminum addition treatment, diethylaluminum chloride was mixed in the natural quartz powder in a non-oxygen atmosphere, and thereafter the mixture was held in the non-oxygen atmosphere at 600° C. for five hours such that aluminum was fixed to the natural quartz powder. In a state in which the aluminum-added quartz powder was dissolved in hydrofluoric acid, the average aluminum concentration thereof was 100 ppm.

Figures 7A, 7B:
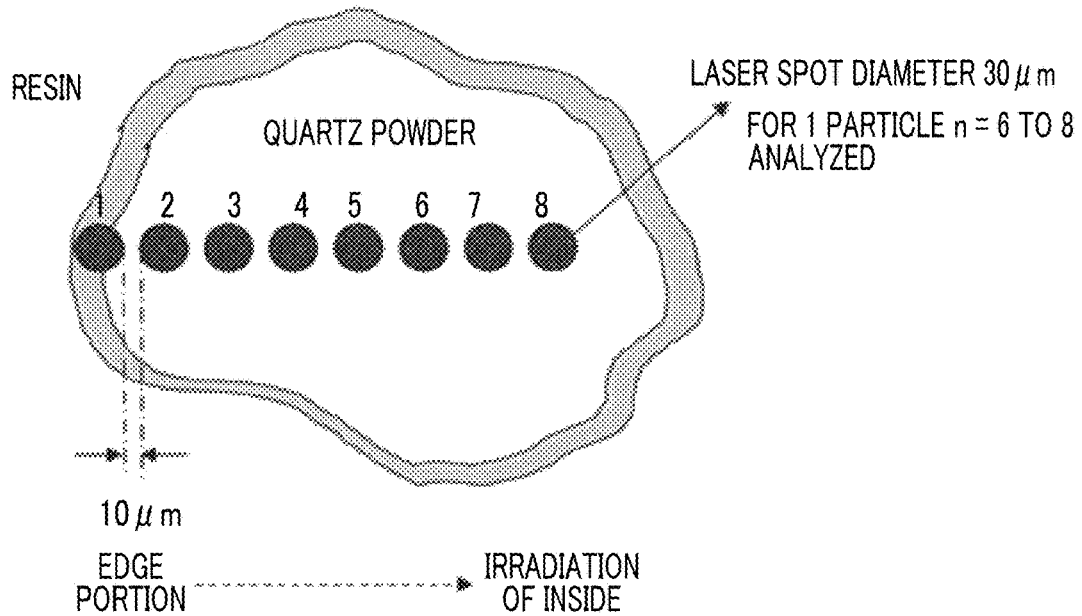
FIG. 7 shows measurement results of an aluminum concentration distribution in the volume of a single aluminum containing quartz particle taken out of aluminum-added quartz powder by a laser irradiation method, in which (a) is an explanatory view of a measurement method, and (b) is a table of the measurement results.

Next, the aluminum concentration distribution in the volume of a single aluminum containing quartz particle taken out of the aluminum-added quartz powder was measured by a laser irradiation method. As illustrated in FIG. 7(a), a laser spot diameter was set to 30 μm, and seven spots were measured at intervals of 10 μm from the top surface toward the inside of the aluminum containing quartz particle. As a result, as illustrated in FIG. 7(b), while the aluminum concentration of the top surface of the quartz particle was 378 ppm, the aluminum concentration of the inside of the quartz particle was 13 to 16 ppm. That is, it was apparent that aluminum was distributed unevenly in the top surface of the quartz particle at a high concentration.

Next, using the natural quartz powder and the aluminum-added quartz powder, three types of samples #1, #2, and #3 for the quartz glass crucible were manufactured by the rotating mold method. Any of the quartz glass crucibles was a crucible having a two-layer structure consisting of the opaque layer 11 and the inner transparent layer 12A in the related art, and decompression melting (step S17 in FIG. 5) was not performed on the vicinity of the outer surface of the crucible.

Sample #1 of the quartz glass crucible was a quartz glass crucible in which the high-aluminum-content layer 14B was not provided on the outer side of the crucible, and samples #2 and #3 were quartz glass crucibles provided with the high-aluminum-content layer 14B. In particular, sample #2 had the high-aluminum-content layer 14B formed by using aluminum-added quartz powder which was not subjected to a degassing treatment, and sample #3 had the high-aluminum-content layer 14B formed by using aluminum-added quartz powder which was subjected to the degassing treatment.

Next, the in-plane distribution of the aluminum concentration of the high-aluminum-content layer of sample #2 of the quartz glass crucible manufactured by using the aluminum-added quartz powder was measured by TOF-SIMS (Time-Of-Flight Secondary Mass Spectrometry: Time-Of-Flight Secondary Ion Mass Spectrometry).

FIG. 8 is a TOF-SIMS ion image map showing the aluminum ion concentration distribution in the high-aluminum-content layer 14B, and shows measurement results at arbitrary three points. As shown in the figure, it was confirmed by the TOF-SIMS ion image map that a region having a high aluminum concentration (linear aluminum-rich parts) and a region having a low aluminum concentration (aluminum-non-rich parts) coexisted within a region of 1 mm$^2$ in the high-aluminum-content layer 14B formed by using the aluminum-added quartz powder described above. In any of the measurement results, the aluminum concentration in the region having a high aluminum concentration was 60 ppm or more, and the aluminum concentration of the region having a low aluminum concentration was less than 25 ppm.

Next, the carbon concentration and the bubble content in the crucible walls of samples #1 to #3 of each of the quartz glass crucibles were evaluated. The carbon concentration was measured by LECO analysis. In addition, the bubble content (%) was measured by the Archimedes' method.

FIG. 9 is a table showing measurement results of the carbon concentration, the sulfur concentration, and the bubble content in samples #1 to #3 of the quartz glass crucibles.

As shown in FIG. 9, the carbon concentration in a natural quartz glass layer (natural layer) of sample #1 of the quartz glass crucible formed of only the natural quartz powder without using the aluminum-added quartz powder was 4.2 ppm, and the sulfur concentration was 4.7 ppm. In addition, the bubble content in the natural quartz glass layer was 2.5%. It should be noted that since the high-aluminum-content layer 14B was not provided, there are no measurement values of the carbon concentration, the sulfur concentration, and the bubble content in the high-aluminum-content layer 14B.

The carbon concentration in a natural quartz glass layer (natural layer) of sample #2 of the quartz glass crucible formed by using the aluminum-added quartz powder which was not subjected to the degassing treatment was 4.2 ppm, the sulfur concentration was 4.7 ppm, and the bubble content was 2.5%, which were not different from the measurement values of sample #1. On the other hand, the carbon concentration in the high-aluminum-content layer 14B was 6.8 ppm, the sulfur concentration was 8.2 ppm, and the bubble content was 2.7%. That is, the carbon concentration, the sulfur concentration, and the bubble content in the high-aluminum-content layer 14B were higher than those of the natural quartz glass layer. The reason why the carbon concentration and the sulfur concentration in the high-aluminum-content layer 14B were higher than those of the natural quartz glass layer is considered to be caused by carbon components or sulfur components attached to the aluminum-added quartz powder and derived from a manufacturing process. In addition, the reason why the bubble content in the high-aluminum-content layer 14B was higher than that of the natural quartz glass layer is considered to be caused by the higher carbon concentration and the higher sulfur concentration in the high-aluminum-content layer 14B.

The carbon concentration in a natural quartz glass layer (natural layer) of sample #3 of the quartz glass crucible formed by using the aluminum-added quartz powder which was subjected to the degassing treatment was 4.2 ppm, the sulfur concentration was 4.7 ppm, and the bubble content was 2.5%, which were not different from the measurement values of samples #1 and #2. On the other hand, the carbon concentration in the high-aluminum-content layer 14B was 4.9 ppm, the sulfur concentration was 3.2 ppm, and the bubble content was 2.1%. That is, the carbon concentration, the sulfur concentration, and the bubble content in the high-aluminum-content layer 14B were decreased by the degassing treatment of the aluminum-added quartz powder.

Next, in addition to the aluminum-added quartz powder having an average aluminum concentration of 100 ppm described above, each of aluminum-added quartz powders having an average aluminum concentration of 20 ppm and 30 ppm was prepared, and a quartz glass crucible having the high-aluminum-content layer 14B was manufactured using such raw material quartz powder. In the manufacturing of the quartz glass crucible, regarding each of the aluminum-added quartz powders having an aluminum concentration of 100 ppm, 30 ppm, and 20 ppm, various quartz glass crucibles were manufactured using the presence or absence of the degassing treatment and the presence or absence of the outer transparent layer 12B as parameters. That is, each of four combinations of (1) in the absence of the degassing treatment and in the absence of the outer transparent layer 12B, (2) in the presence of the degassing treatment and in the absence of the outer transparent layer 12B, (3) in the absence of the degassing treatment and in the presence of the outer transparent layer 12B, and (4) in the presence of the degassing treatment and in the presence of the outer transparent layer 12B.

Next, a foaming test (heating test) was conducted on the quartz glass crucibles, and the presence or absence of the occurrence of foaming and delamination was evaluated. In the foaming test, the crucible was held in a heating test furnace at a temperature of 1580° C. and a pressure of 20 torr for 50 hours and thereafter the temperature was increased to be 1680° C. and held for five hours.

FIG. 10 is a table showing the results of the heating test of the quartz glass crucibles.

As shown in FIG. 10, the crystallization rate of the quartz glass crucibles in Comparative Examples 1 and 2 and Example 1 having the high-aluminum-content layer 14B having an average aluminum concentration of 100 ppm was about 48 μm/h. Particularly, the bubble content in the high-aluminum-content layer 14B of the crucible of Comparative Example 1 in which the aluminum-added quartz powder was not subjected to a pretreatment was 2.7%, and foaming and delamination had occurred in the crucible after the foaming test. The bubble content in the high-aluminum-content layer 14B of the crucible of Comparative Example 2 in which the aluminum-added quartz powder was subjected to the pretreatment was decreased to 2.2%, but foaming and delamination had occurred. Even in the case where the aluminum-added quartz powder was not subjected to the pretreatment, the bubble content in the high-aluminum-content layer 14B of the crucible of Example 1 in which the outer transparent layer 12B was formed by subjecting the outermost layer to decompression melting was decreased to 1.0%, and foaming and delamination had not occurred after the foaming test.

The crystallization rate of the quartz glass crucibles of Comparative Examples 3 and 4 and Examples 2 and 3 having the high-aluminum-content layer 14B having an average aluminum concentration of 30 ppm was about 20 μm/h. Particularly, the bubble content in the high-aluminum-content layer 14B of the crucible of Comparative Example 3 in which the aluminum-added quartz powder was not subjected to the pretreatment was 2.5%, and foaming and delamination had occurred in the crucible after the foaming test. The bubble content in the high-aluminum-content layer 14B of the crucible of Comparative Example 4 in which the aluminum-added quartz powder was subjected to the pretreatment was decreased to 2.0%, but foaming and delamination had occurred because the crystallization rate was faster than in Example 4, which will be described later. Even in the case where the aluminum-added quartz powder was not subjected to the pretreatment, the bubble content in the high-aluminum-content layer 14B of the crucible of Example 2 in which the outer transparent layer 12B was formed by subjecting the outermost layer to decompression melting was decreased to 0.6%, and foaming and delamination had not occurred. Furthermore, the bubble content in the high-aluminum-content layer 14B of the crucible of Example 3 in which the outer transparent layer 12B was formed by subjecting the aluminum-added quartz powder to the pretreatment and subjecting the outermost layer to decompression melting was decreased to 0.4%, and foaming and delamination had not occurred after the foaming test.

The crystallization rate of the quartz glass crucibles of Comparative Example 5 and Examples 4 and 5 having the high-aluminum-content layer 14B having an average aluminum concentration of 20 ppm was about 12 μm/h, the bubble content in the high-aluminum-content layer 14B of the crucible of Comparative Example 5 in which the aluminum-added quartz powder was not subjected to the pretreatment was 2.4%, and foaming and delamination had occurred in this crucible after the foaming test. The bubble content in the high-aluminum-content layer 14B of the crucible of Example 4 in which the aluminum-added quartz powder was subjected to the pretreatment was decreased to 2.0%, but foaming and delamination had not occurred after the foaming test. Even in the case where the aluminum-added quartz powder was not subjected to the pretreatment, the bubble content in the high-aluminum-content layer 14B of the crucible of Example 5 in which the outer transparent layer 12B was formed by subjecting the outermost layer to decompression melting was decreased to 0.5%, and foaming and delamination had not occurred after the foaming test.

DESCRIPTION OF THE SYMBOLS 1 quartz glass crucible
1a straight body portion
1b bottom portion
1c corner portion
10a inner surface of crucible
10b outer surface of crucible
11 opaque layer
12A inner transparent layer
12B outer transparent layer
14A low-aluminum-content layer
14B high-aluminum-content layer
15 crystallized layer
15S interface between crystallized layer and quartz glass layer
16 raw material quartz powder (deposition layer of raw material quartz powder)
16A natural quartz powder
16B aluminum-added quartz powder mold
20a inner surface of mold
22 vent hole
31 quartz powder
32 arc atmosphere gas
33 bubble
34 quartz glass

What is claimed is:

1. A quartz glass crucible for pulling up a silicon single crystal, comprising:
    a high-aluminum-content layer which is made of quartz glass having a relatively high average aluminum concentration and is provided to form an outer surface of the quartz glass crucible; and
    a low-aluminum-content layer which is made of quartz glass having a lower average aluminum concentration than that in the high-aluminum-content layer and is provided on an inner side of the high-aluminum-content layer,
    wherein the low-aluminum-content layer includes an opaque layer made of quartz glass containing a large number of minute bubbles, and
    the high-aluminum-content layer is made of transparent or translucent quartz glass having a lower bubble content than does the opaque layer,
    wherein an average aluminum concentration in the high-aluminum-content layer is 20 ppm or more, and
    an average aluminum concentration in the low-aluminum-content layer is less than 20 ppm.

2. The quartz glass crucible according to claim 1, further comprising:
    an inner transparent layer which is provided on an inner side of the opaque layer to form an inner surface of the quartz glass crucible and contains substantially no bubbles; and
    an outer transparent layer which is provided on an outer side of the opaque layer to form an outer surface of the quartz glass crucible and contains substantially no bubbles,
    wherein a thickness of the high-aluminum-content layer is thinner than that of the outer transparent layer.

3. The quartz glass crucible according to claim 1, further comprising:
    a cylindrical straight body portion;
    a curved bottom portion; and
    a corner portion which connects the straight body portion to the bottom portion, wherein the high-aluminum-content layer is provided in at least the straight body portion.

4. The quartz glass crucible according to claim 2, wherein a bubble content in the outer transparent layer is 2.1% or less.

5. The quartz glass crucible according to claim 1,
wherein an aluminum concentration distribution in the high-aluminum-content layer is microscopically unevenly distributed.

6. The quartz glass crucible according to claim 5,
wherein a part with a high aluminum concentration is present in a mesh form within a region of 1 mm$^3$ in the high-aluminum-content layer.

7. The quartz glass crucible according to claim 6,
wherein a high-aluminum-concentration region having an aluminum concentration of 60 ppm or more and a low-aluminum-concentration region having an aluminum concentration of less than 25 ppm coexist within a region of 1 mm$^2$.

8. The quartz glass crucible according to claim 7,
wherein an aluminum concentration gradient in a vicinity of a boundary between the high concentration region and the low concentration region is 1 ppm/μm or more and 100 ppm/μm or less.

9. The quartz glass crucible according to claim 1,
wherein an average concentration of each of carbon and sulfur in the high-aluminum-content layer is 5 ppm or less.

10. The quartz glass crucible according to claim 9,
wherein the bubble content in the high-aluminum-content layer is less than 0.5%.

11. A manufacturing method of a quartz glass crucible according to a rotating mold method, the manufacturing method comprising:
a step of forming a deposition layer of raw material quartz powder by depositing aluminum-added quartz powder and natural quartz powder in this order on an inner surface of a rotating mold; and
a step of subjecting the deposition layer of the raw material quartz powder to arc melting from an inner side of the mold,
wherein the step of subjecting the deposition layer of the raw material quartz powder to the arc melting includes
a step of forming an inner transparent layer made of quartz glass with substantially no bubbles contained therein by strengthening a degree of decompression through a large number of vent holes provided in the inner surface of the mold at the time of start of the arc melting,
a step of forming an opaque layer made of quartz glass containing a large number of minute bubbles by weakening the degree of decompression after forming the inner transparent layer, and
a step of forming an outer transparent layer made of quartz glass with substantially no bubbles contained therein by strengthening the degree of decompression again after forming the opaque layer, and
in the step of forming the outer transparent layer, a high-aluminum-content layer is formed by melting the aluminum-added quartz powder, and a timing at which the degree of decompression is strengthened again is controlled to form the outer transparent layer so as to cause a thickness of the outer transparent layer to be thicker than that of the high-aluminum-content layer,
wherein a low-aluminum-content layer which is made of quartz glass having a lower average aluminum concentration than that in the high-aluminum-content layer is provided on an inner side of the high-aluminum-content layer,
an average aluminum concentration in the high-aluminum-content layer is 20 ppm or more, and
an average aluminum concentration in the low-aluminum-content layer is less than 20 ppm.

12. The manufacturing method of a quartz glass crucible according to claim 11,
wherein a thickness of the high-aluminum-content layer is 200 μm or more.

13. The manufacturing method of a quartz glass crucible according to claim 11,
wherein an average particle size of the aluminum-added quartz powder is 100 to 400 μm,
an aluminum concentration of a top surface of the aluminum-added quartz powder is 60 ppm or more, and
an aluminum concentration of a center portion of the aluminum-added quartz powder is less than 25 ppm.

14. The manufacturing method of a quartz glass crucible according to claim 13, further comprising:
a step of preparing the aluminum-added quartz powder before filling the mold with the aluminum-added quartz powder,
wherein the step of preparing the aluminum-added quartz powder includes
a fixing step of fixing aluminum to the natural quartz powder by mixing a solution containing an aluminum compound in the natural quartz powder and thereafter dehydrating and drying the mixture, and
a first heat treatment step of allowing the aluminum to penetrate into a surface layer portion of the natural quartz powder by heating the natural quartz powder to which the aluminum is fixed at a temperature of 1000° C. or higher and 1200° C. or lower, at which temperature the natural quartz powder is not sintered.

15. The manufacturing method of a quartz glass crucible according to claim 14,
wherein a heating time in the first heat treatment step is two hours or longer and 20 hours or shorter.

16. The manufacturing method of a quartz glass crucible according to claim 14,
wherein an aluminum concentration distribution in the high-aluminum-content layer of the quartz glass crucible is measured by secondary ion mass spectrometry, and on the basis of measurement results of the aluminum concentration distribution, a concentration of the solution containing the aluminum compound used for manufacturing a subsequent quartz glass crucible, or a heat treatment time or a heat treatment temperature for the aluminum-added quartz powder is adjusted.

17. The manufacturing method of a quartz glass crucible according to claim 11, further comprising:
a step of removing impurities derived from carbon and sulfur adhered to the aluminum-added quartz powder and other manufacturing processes before filling the mold with the aluminum-added quartz powder.

18. The manufacturing method of a quartz glass crucible according to claim 17,
wherein the step of removing the impurities includes
a second heat treatment step of heating the aluminum-added quartz powder in a chamber in an air atmosphere at normal pressure at 1000° C. or higher and 1200° C. or lower,
a first holding step of evacuating an inside of the chamber and holding the aluminum-added quartz powder in a vacuum for a predetermined time, and
a second holding step of changing the inside of the chamber to a helium atmosphere at normal pressure and holding the aluminum-added quartz powder in the helium atmosphere at normal pressure for a predetermined time.

19. The manufacturing method of a quartz glass crucible according to claim 18,
wherein a heating time in the second heat treatment step is two hours or longer and 20 hours or shorter.

20. A quartz glass crucible for pulling up a silicon single crystal, comprising:
a high-aluminum-content layer which is made of quartz glass having a relatively high average aluminum concentration and is provided to form an outer surface of the quartz glass crucible; and
a low-aluminum-content layer which is made of quartz glass having a lower average aluminum concentration than that in the high-aluminum-content layer and is provided on an inner side of the high-aluminum-content layer,
wherein a part with a high aluminum concentration is present in a mesh form within a region of 1 mm$^3$ in the high-aluminum-content layer, and
a high-aluminum-concentration region having an aluminum concentration of 60 ppm or more and a low-aluminum-concentration region having an aluminum concentration of less than 25 ppm coexist within a region of 1 mm$^2$.

21. The quartz glass crucible according to claim 20,
wherein the low-aluminum-content layer includes an opaque layer made of quartz glass containing a large number of minute bubbles, and
the high-aluminum-content layer is made of transparent or translucent quartz glass having a lower bubble content than does the opaque layer.

22. The quartz glass crucible according to claim 21, further comprising:
an inner transparent layer which is provided on an inner side of the opaque layer to form an inner surface of the quartz glass crucible and contains substantially no bubbles; and
an outer transparent layer which is provided on an outer side of the opaque layer to form an outer surface of the quartz glass crucible and contains substantially no bubbles,
wherein a thickness of the high-aluminum-content layer is thinner than that of the outer transparent layer.

23. The quartz glass crucible according to claim 20, further comprising:
a cylindrical straight body portion;
a curved bottom portion; and
a corner portion which connects the straight body portion to the bottom portion,
wherein the high-aluminum-content layer is provided in at least the straight body portion.

24. The quartz glass crucible according to claim 22,
wherein a bubble content in the outer transparent layer is 2.1% or less.

25. The quartz glass crucible according to claim 20,
wherein an aluminum concentration gradient in a vicinity of a boundary between the high concentration region and the low concentration region is 1 ppm/μm or more and 100 ppm/μm or less.

26. The quartz glass crucible according to claim 20,
wherein an average concentration of each of carbon and sulfur in the high-aluminum-content layer is 5 ppm or less.

27. The quartz glass crucible according to claim 26,
wherein the bubble content in the high-aluminum-content layer is less than 0.5%.

* * * * *